US010276463B2

(12) United States Patent
Yanagida

(10) Patent No.: US 10,276,463 B2
(45) Date of Patent: Apr. 30, 2019

(54) SEMICONDUCTOR DEVICE AND METHOD FOR MANUFACTURING THE SAME

(71) Applicant: ROHM CO., LTD., Kyoto-shi, Kyoto (JP)

(72) Inventor: Hideaki Yanagida, Kyoto (JP)

(73) Assignee: ROHM CO., LTD., Kyoto (JP)

( * ) Notice: Subject to any disclaimer, the term of this patent is extended or adjusted under 35 U.S.C. 154(b) by 0 days.

(21) Appl. No.: 15/728,127

(22) Filed: Oct. 9, 2017

(65) Prior Publication Data

US 2018/0108582 A1 Apr. 19, 2018

(30) Foreign Application Priority Data

Oct. 17, 2016 (JP) ................................ 2016-203506

(51) Int. Cl.

| | |
|---|---|
| ***H01L 23/10*** | (2006.01) |
| ***H01L 23/13*** | (2006.01) |
| ***H01L 23/14*** | (2006.01) |
| ***H01L 23/48*** | (2006.01) |
| ***H01L 21/02*** | (2006.01) |
| ***H01L 21/56*** | (2006.01) |
| ***H01L 21/48*** | (2006.01) |
| ***H01L 23/31*** | (2006.01) |

(52) U.S. Cl.

CPC ........ *H01L 23/10* (2013.01); *H01L 21/02013* (2013.01); *H01L 21/02697* (2013.01); *H01L 21/4878* (2013.01); *H01L 21/56* (2013.01); *H01L 23/13* (2013.01); *H01L 23/147* (2013.01); *H01L 23/3121* (2013.01); *H01L 23/48* (2013.01); *H01L 2224/16* (2013.01); *H01L 2924/181* (2013.01)

(58) Field of Classification Search

CPC combination set(s) only.
See application file for complete search history.

(56) References Cited

U.S. PATENT DOCUMENTS

2003/0071365 A1* 4/2003 Kobayakawa .......... H01L 24/97 257/787
2005/0023670 A1* 2/2005 Hata ................. H01L 23/49562 257/690
2011/0215349 A1* 9/2011 An ........................ H01L 33/486 257/89

FOREIGN PATENT DOCUMENTS

JP 2005-277380 A 10/2005
JP 2005-340378 A 12/2005

* cited by examiner

*Primary Examiner* — Mounir S Amer
(74) *Attorney, Agent, or Firm* — Hamre, Schumann, Mueller & Larson, P.C.

(57) ABSTRACT

A semiconductor device includes a substrate with a recess subsiding from a selected surface of the substrate to accommodate a semiconductor element. Connected to the semiconductor element, an electroconductive portion extends from the recess onto the selected surface. A post, formed at the selected surface, has a first surface in contact with the electroconductive portion, a second surface, and a side surface between the first and second surfaces. A sealing resin covers the side surface of the post and the semiconductor element, and has a mounting surface facing in the same direction as the selected surface of the substrate. A pad, on the mounting surface of the sealing resin, is in contact with the second surface of the post. In the thickness direction, the second surface of the post is offset from the mounting surface of the sealing resin toward the selected surface of the substrate.

31 Claims, 17 Drawing Sheets

SEMICONDUCTOR DEVICE AND METHOD FOR MANUFACTURING THE SAME

FIELD

The present disclosure generally relates to semiconductor devices. In particular, the present disclosure relates to a semiconductor device including a substrate made of a monocrystal intrinsic semiconductor material, and a semiconductor element mounted on the substrate. The present disclosure also relates to a method for manufacturing such a semiconductor device.

BACKGROUND

Conventionally, there have been proposed various types of semiconductor devices (see JP-A-2005-277380 and JP-A-2005-340378, for example). One of such conventional devices is made up of, for example, a circuit board formed with via holes, and an IC chip mounted on the circuit board. As is known, a via hole is filled with an electroconductive member for electrical connection between one end and the other of the hole. On the rear or mounting surface of the circuit board, a number of solder bumps for external connection may be formed in a manner such that each bump is electrically connected to a relevant one of the via holes exposed at the mounting surface of the board.

In the above conventional semiconductor device, the electroconductive member in each via hole may be formed of a paste of electroconductive material. Thus, during the manufacturing process of the semiconductor device, part of the paste once filled into a via may leak out onto the mounting surface of the board and solidify. In this situation, when a solder bump is to be formed on the exposed face of the electroconductive member together with the solidified leak, the resultant bump will be unduly larger than expected, due to the additional covering of the leaked portion. Such an enlarged bump, however, is not desirable in terms of avoiding the occurrence of short-circuiting upon mounting the device on the circuit board.

SUMMARY

The present disclosure is proposed in view of the foregoing circumstances. It is therefore an object of the disclosure is to provide a semiconductor device capable of overcoming, or at least alleviating, the drawback of the conventional device. It is another object of the present disclosure to provide a manufacturing method of making such an improved semiconductor device.

According to a first aspect of the present disclosure, there is provided a semiconductor device that includes: a substrate having a first surface and a second surface that are spaced apart from each other in a thickness direction, where the substrate is formed with a recess subsiding from the second surface; a semiconductor element disposed in the recess; an electroconductive portion extending from the recess onto the second surface of the substrate and electrically connected to the semiconductor element; a post disposed at the second surface of the substrate and having a first electroconductive surface in contact with the electroconductive portion, a second electroconductive surface opposite to the first electroconductive surface and a side surface extending between the first electroconductive surface and the second electroconductive surface; a sealing resin having a mounting surface that faces in a same direction as the second surface of the substrate, the sealing resin covering the side surface of the post and the semiconductor element; and a pad in contact with the second electroconductive surface of the post and exposed to an outside from the mounting surface of the sealing resin. The substrate may be made of a monocrystal intrinsic semiconductor material. In the thickness direction, the second electroconductive surface of the post is offset from the mounting surface of the sealing resin toward the second surface of the substrate.

According to a second aspect of the present disclosure, there is provided a method for manufacturing a semiconductor device. The method includes: forming a groove in a base member having a first surface and a second surface that are spaced apart from each other in a thickness direction, where the base member is made of a monocrystal intrinsic semiconductor material, and the groove subsides from the second surface to have a bottom surface; forming an electroconductive layer in contact with the groove and the second surface of the base member; forming a post at the second surface of the base member so as to be in contact with the electroconductive layer; mounting a semiconductor element on the bottom surface of the groove so as to be electrically connected to the electroconductive layer; forming a sealing resin covering the post and the semiconductor element; exposing a part of the post from the sealing resin; and forming a pad in contact with the exposed part of the post. The forming of the pad is performed after the exposed part of the post is removed.

Other features and advantages of the present disclosure will become apparent from the detailed description given below with reference to the accompanying drawings.

DRAWINGS

DETAILED DESCRIPTION

Figure 1:
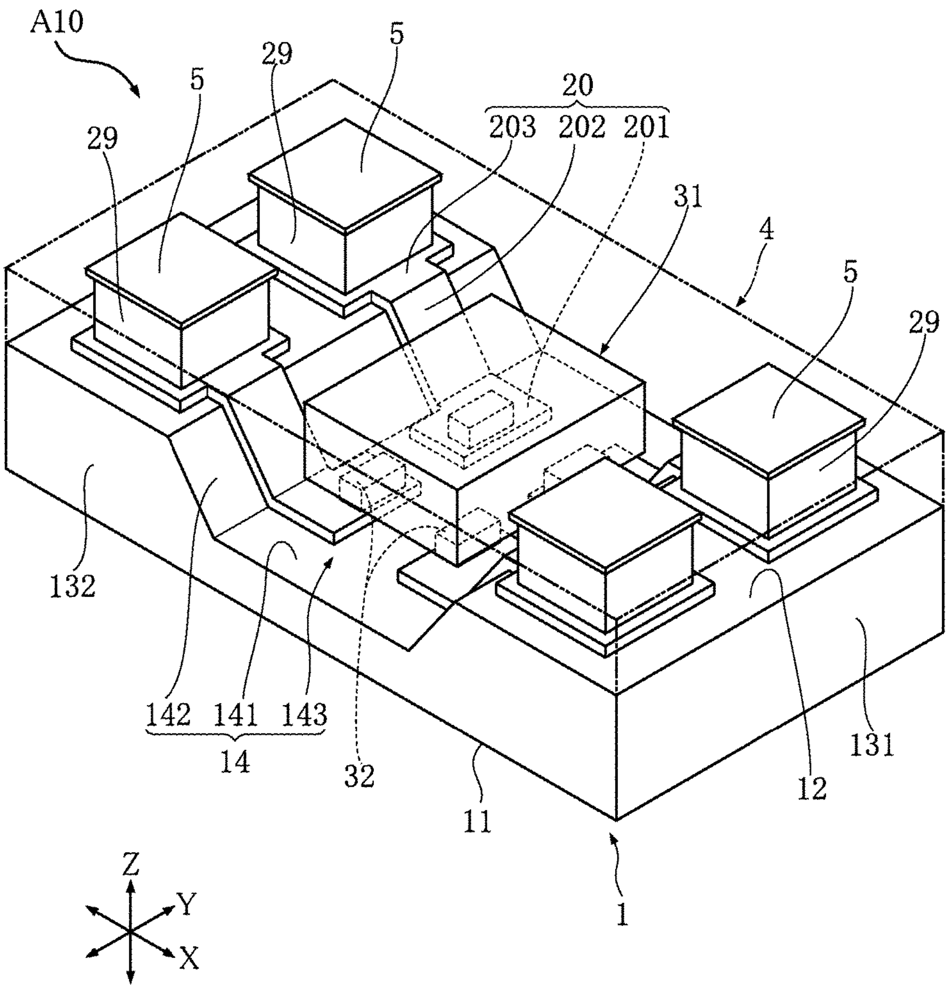
FIG. 1 is a perspective view (a sealing resin shown transparent) depicting a semiconductor device according to the present disclosure.

The present disclosure is described below in accordance with several exemplary embodiments and with reference to the accompanying drawings.

A semiconductor device A10 according to an embodiment is described below with reference to FIGS. 1 to 8. The semiconductor device A10 includes a substrate 1, electroconductive portions 20, connecting posts 29, a semiconductor element 31 (which may be a primary functional element), electroconductive joints 32, a sealing resin 4, and pads 5.

Figure 2:
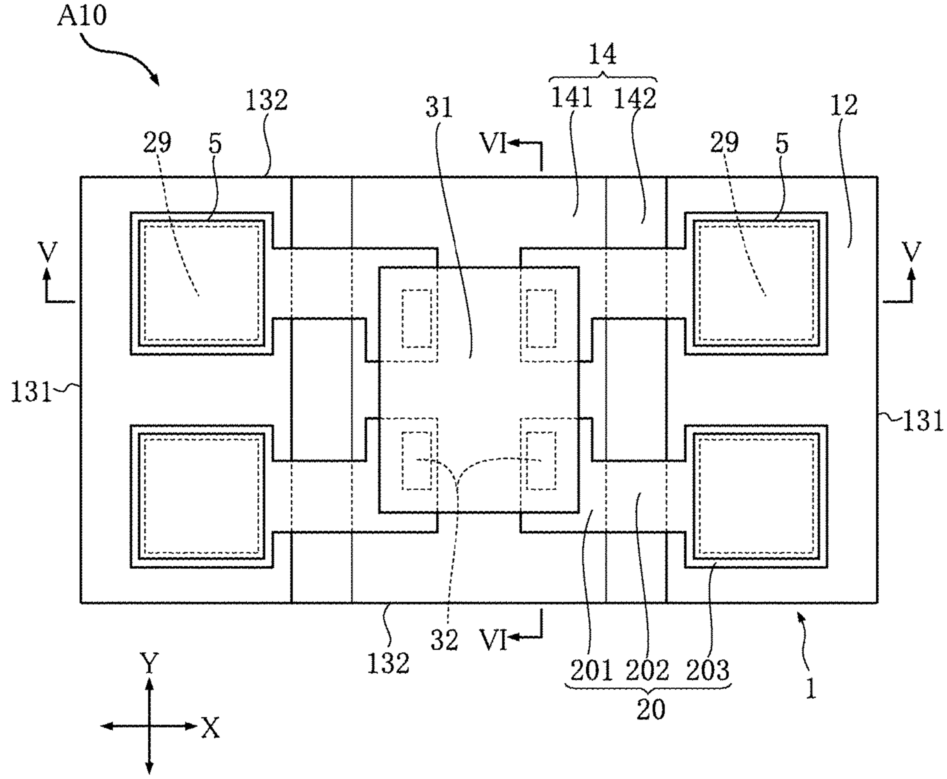
FIG. 2 is a bottom view (the sealing resin shown transparent) depicting the semiconductor device in FIG. 1.
Figure 3:
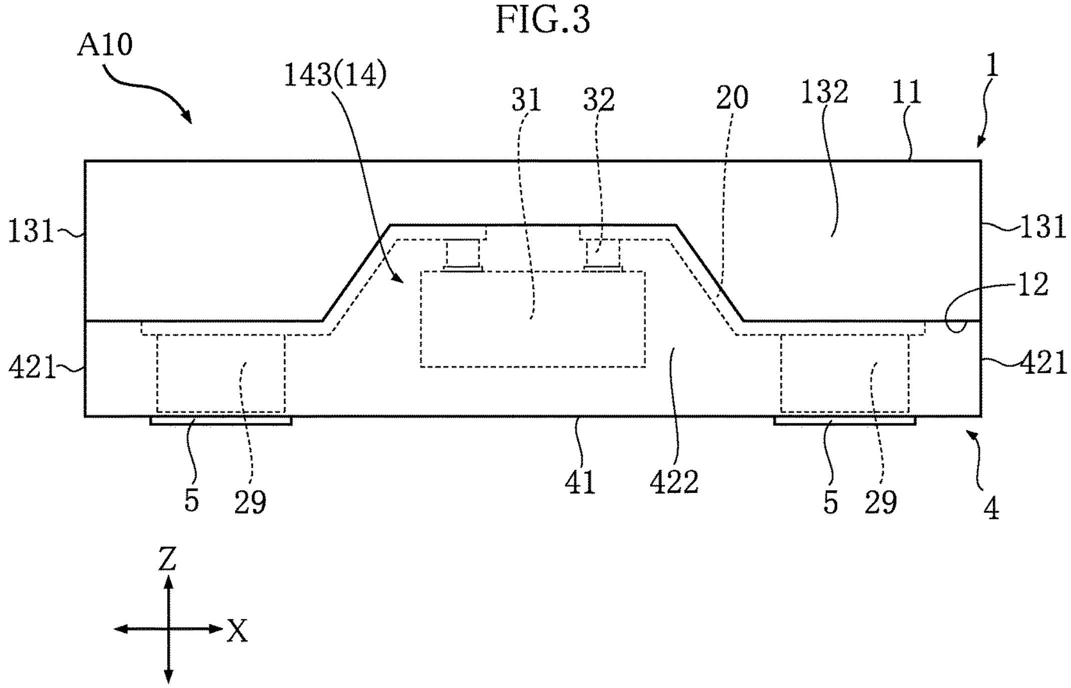
FIG. 3 is a front view showing the semiconductor device in FIG. 1.
Figure 4:
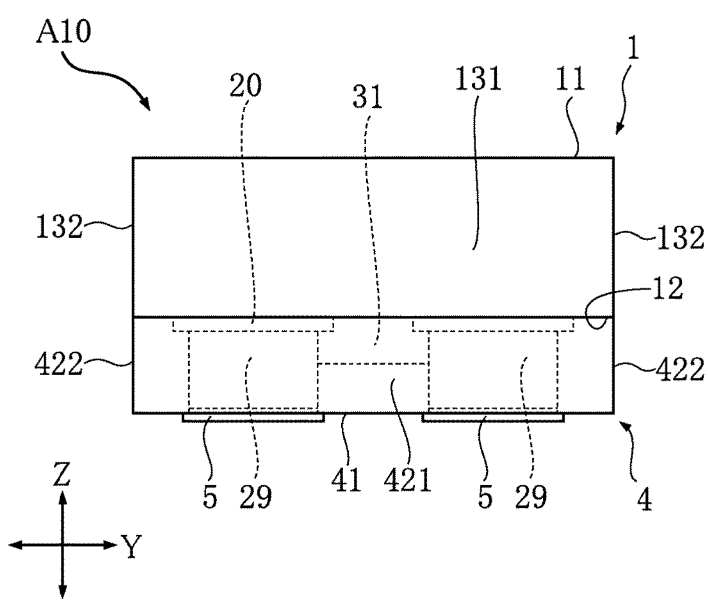
FIG. 4 is a right side view showing the semiconductor device in FIG. 1.
Figure 5:
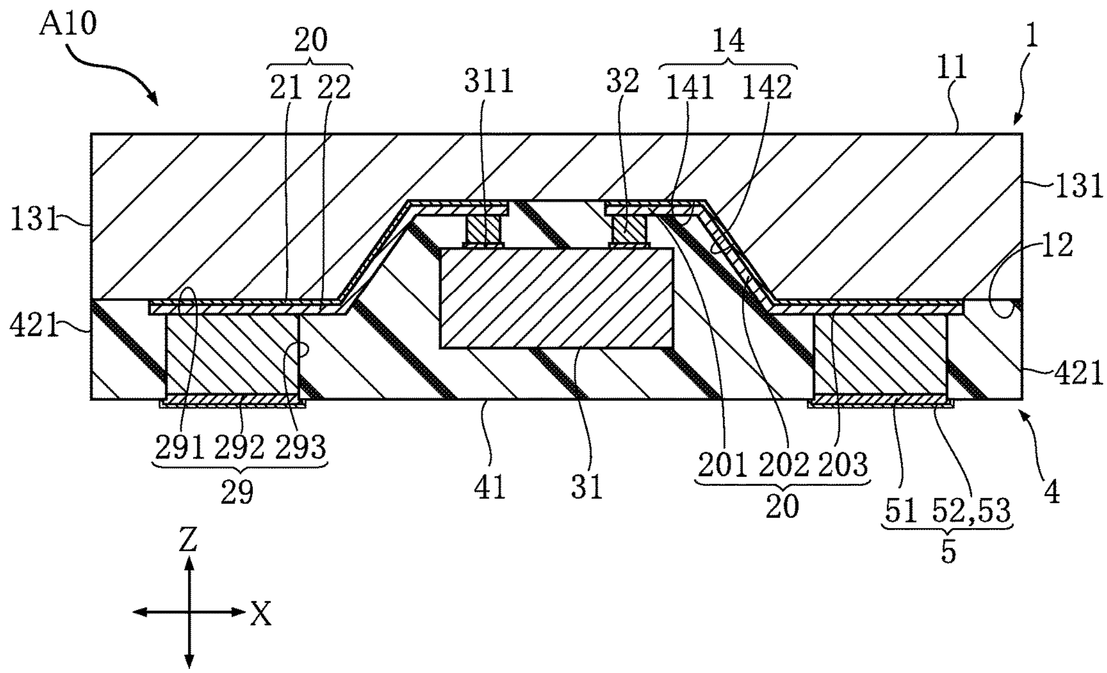
FIG. 5 is a cross-sectional view taken along line V-V in FIG. 2.
Figure 6:
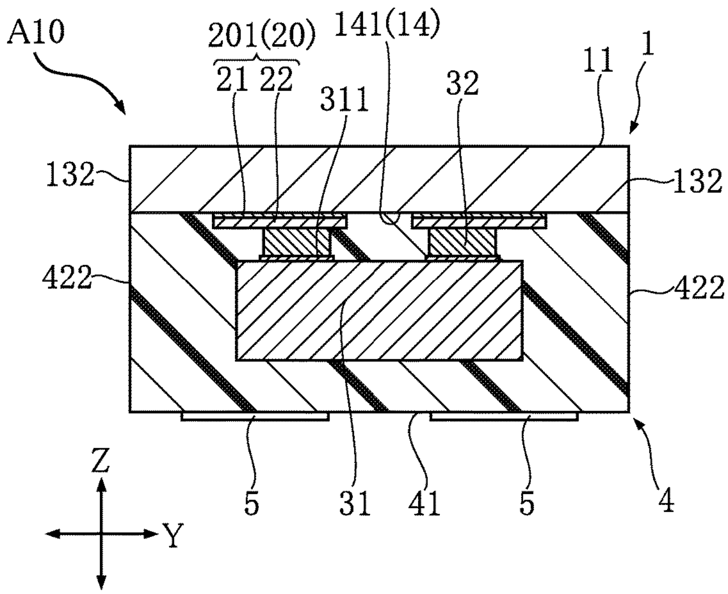
FIG. 6 is a cross-sectional view taken along line VI-VI in FIG. 2.
Figure 7:
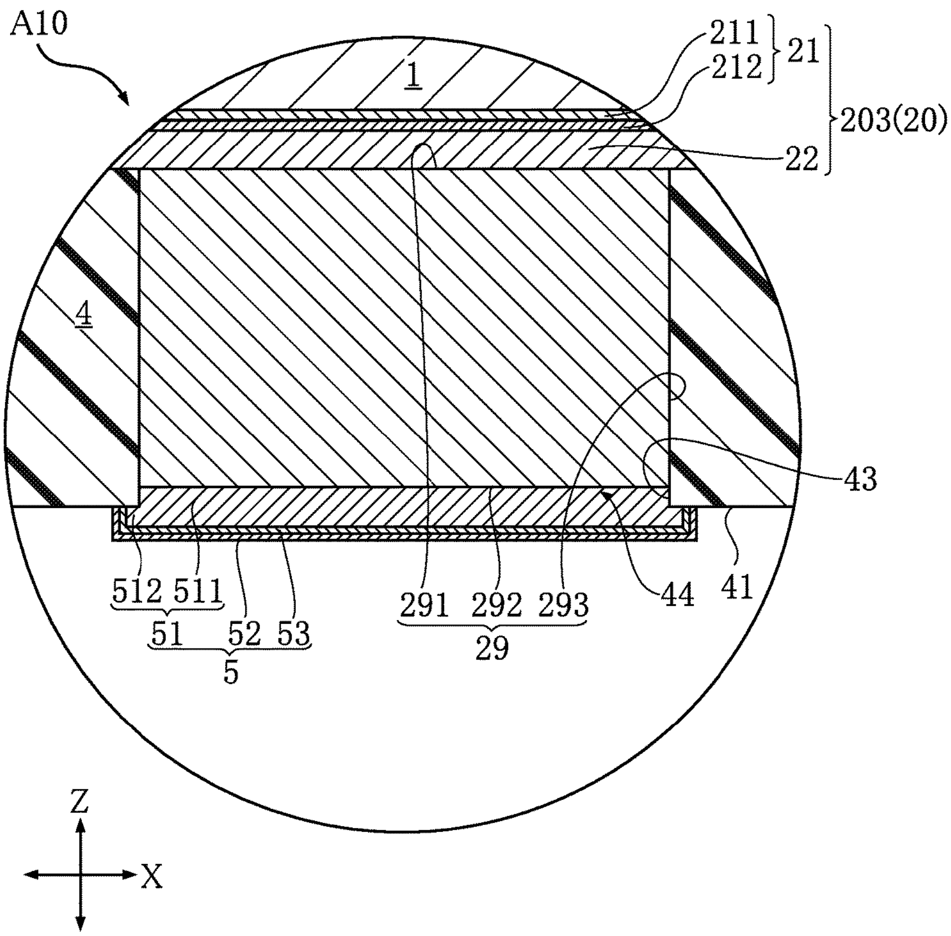
FIG. 7 is a partially enlarged view of FIG. 6.
Figure 8:
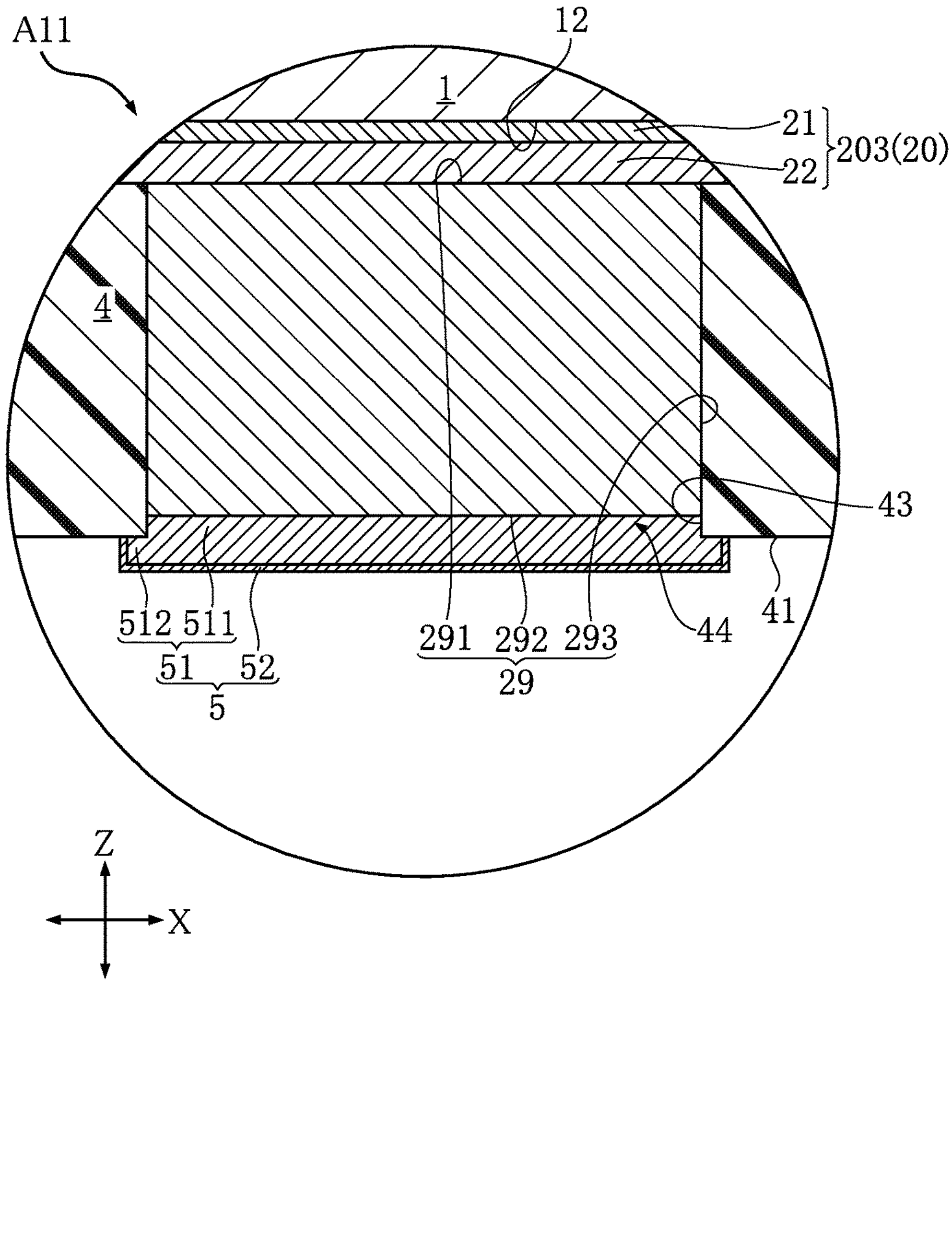
FIG. 8 is a partially enlarged cross-sectional view showing a variation of the semiconductor device according to the present disclosure.

FIG. 1 is a perspective view showing the semiconductor device A10. FIG. 2 is a bottom view showing the semiconductor device A10. In FIGS. 1 and 2, the sealing resin 4 is shown transparent for ease of understanding. Note that FIG. 1 shows the outline of the transparent sealing resin 4 with an imaginary line (two-dot chain line). FIG. 3 is a front view showing the semiconductor device A10. FIG. 4 is a right side view showing the semiconductor device A10. FIG. 5 is a cross-sectional view taken along line V-V in FIG. 2. FIG. 6 is a cross-sectional view taken along line VI-VI in FIG. 2. FIG. 7 is a partially enlarged view of FIG. 5. FIG. 8 is a partially enlarged cross-sectional view showing a semiconductor device A11, which is a variation of the semiconductor device A10. The cross-sectional position and cross-sectional area in FIG. 8 are the same as those in FIG. 7.

The semiconductor device A10 is designed to be surface-mounted on a circuit board used in various electronics. As shown in FIG. 1, the semiconductor device A10 is rectangular as seen in the thickness direction Z of the substrate 1 (in plan view). The long side direction of the semiconductor device A10 perpendicular to the thickness direction Z of the substrate 1 is referred to as direction X. Also, the short side direction of the semiconductor device A10 perpendicular to both the thickness direction Z and the direction X is referred to as direction Y.

As shown in FIGS. 1 to 6, the substrate 1 is a member that accommodates the semiconductor element 31 and that is for mounting the semiconductor device A10 on a circuit board. The substrate 1 is made of a monocrystal intrinsic semiconductor material. In the present embodiment, without limitation, the intrinsic semiconductor material is Si (silicon). The substrate 1 has a rectangular shape in plan view with its long sides oriented along the direction X. The substrate 1 has a first or obverse surface 11, a second or reverse surface 12, first side surfaces 131, second side surfaces 132, and a recess 14.

As shown in FIGS. 1 to 5, the obverse surface 11 and the reverse surface 12 face away from each other in the thickness direction Z of the substrate 1. The obverse surface 11 and the reverse surface 12 are flat surfaces orthogonal to the thickness direction Z of the substrate 1. The obverse surface 11 is an upper surface of the substrate 1 shown in FIGS. 3 to 5, and has a rectangular shape. The obverse surface 11 is exposed to the outside of the semiconductor device A10. The reverse surface 12 is a lower surface of the substrate 1 shown in FIGS. 3 to 5, and is made up of two regions that are separated from each other in the direction X. Each region of the reverse surface 12 has a rectangular shape. In plan view, the recess 14 is positioned between the two regions of the reverse surface 12. The reverse surface 12 is provided with parts of the electroconductive portions 20. Parts of the reverse surface 12 on which the electroconductive portions 20 are not provided are covered with the sealing resin 4. Accordingly, the reverse surface 12 is in contact with the electroconductive portions 20 and the sealing resin 4. In the present embodiment, the reverse surface 12 is a (100) surface.

As shown in FIGS. 1 to 4, the first side surfaces 131 are a pair of flat surfaces that are sandwiched between and orthogonal to the obverse surface 11 and the reverse surface 12, and that are separated from each other in the direction X. Each of the first side surfaces 131 has a rectangular shape. As shown in FIGS. 1 to 4, the second side surfaces 132 are a pair of flat surfaces that are sandwiched between and orthogonal to the obverse surface 11 and the reverse surface 12, and that are separated from each other along the direction Y. Each of the second side surfaces 132 is a flat surface. Both ends of each second side surface 132 in the direction X are connected to the pair of first side surfaces 131.

As shown in FIGS. 1, 2, 5, and 6, the recess 14 subsides from the reverse surface 12 and accommodates the semiconductor element 31. The recess 14 has a rectangular shape in plan view. The recess 14 is provided with parts of the electroconductive portions 20 and is filled with the sealing resin 4. Accordingly, the recess 14 is in contact with the electroconductive portions 20 and the sealing resin 4. The recess 14 has a bottom surface 141 and intermediate side surfaces 142.

As shown in FIGS. 1, 5, and 6, the bottom surface 141 is a flat surface that is positioned between the obverse surface 11 and the reverse surface 12 in the thickness direction Z of the substrate 1, and that is orthogonal to the thickness direction Z of the substrate 1. The bottom surface 141 has a rectangular shape in plan view. The bottom surface 141 is provided with parts of the electroconductive portions 20 on which the semiconductor element 31 is mounted.

As shown in FIGS. 1 and 5, the intermediate side surfaces 142 are flat surfaces that are connected to the bottom surface 141 and the reverse surface 12 and are inclined relative to the bottom surface 141. The intermediate side surfaces 142 according to the present embodiment are a pair of surfaces that are separated from each other along the direction X. Each of the intermediate side surfaces 142 has the same inclination angle relative to the bottom surface 141. The inclination angle is 54.74°. The intermediate side surfaces 142 are provided with parts of the electroconductive portions 20. The intermediate side surfaces 142 according to the present embodiment are (111) surfaces.

As shown in FIGS. 1 and 3, the recess 14 is formed with a pair of openings 143 that are separated from each other in the direction Y. The periphery of each opening 143 is a boundary line at which the second side surface 132 intersects with the bottom surface 141 and the intermediate side surface 142. Each of the openings 143 has a trapezoidal shape. The sealing resin 4 is exposed from the openings 143.

As shown in FIGS. 1, 2, 5 and 6, the electroconductive portions 20 are electroconductive members, provided in contact with the recess 14 and the reverse surface 12 of the substrate 1, and electrically connected to the semiconductor element 31. Each of the electroconductive portions 20 includes an underlying layer 21 and a plating layer 22 that are stacked on each other. The underlying layer 21 is in contact with the substrate 1 and covered with the plating layer 22. In the present embodiment, the underlying layer 21 has a thickness of 200 to 300 nm, and the plating layer 22 has a thickness of 3 to 10 μm. Thus, the underlying layer 21 is thinner than the plating layer 22. As shown in FIG. 7, the underlying layer 21 may include a first underlying layer 211 in contact with the substrate 1, and a second underlying layer 212 interposed between the first underlying layer 211 and the plating layer 22. The second underlying layer 212 and the plating layer 22 may be made of the same material. In the present embodiment, the first underlying layer 211 is made of Ti, while the second underlying layer 212 and the plating layer 22 are made of Cu.

As shown in FIGS. 1, 2, and 5, each of the electroconductive portions 20 includes a bottom surface electroconductive portion 201, an intermediate side surface electroconductive portion 202, and a reverse surface electroconductive portion 203. The bottom surface electroconductive portion 201 is a part of the electroconductive portion 20 that is provided in contact with the bottom surface 141 of the recess 14. The semiconductor element 31 is mounted on the bottom surface electroconductive portion 201 to be electrically connected to the electroconductive portion 20. The intermediate side surface electroconductive portion 202 is a part of the electroconductive portion 20 that is provided in contact with the intermediate side surface 142 of the recess 14. One end of the intermediate side surface electroconductive portion 202 is connected to the bottom surface electroconductive portion 210 and the other to the reverse surface electroconductive portion 203. Accordingly, the bottom surface electroconductive portion 201 and the reverse surface electroconductive portion 203 are electrically connected to each other through the intermediate side surface electroconductive portion 202. The reverse surface electroconductive portion 203 is apart of the electroconductive portion 20 provided in contact with the reverse surface 12 of the substrate 1. The reverse surface electroconductive portion 203 is electrically connected to a corresponding one of the posts 29. Note that the illustrated shapes of the bottom surface electroconductive portion 201, the intermediate side surface electroconductive portion 202, and the reverse surface electroconductive portion 203 are merely examples, and the shapes of these portions may be suitably modified depending on the applications.

As shown in FIGS. 1, 5, and 7, each of the posts 29 is an electroconductive member that has a first electroconductive surface 291, a second electroconductive surface 292, and side surfaces 293, and that is electrically connected to the electroconductive portion 20. Each of the posts 29 has a rectangular parallelepiped shape and is made of Cu. The first electroconductive surface 291 is in contact with the reverse surface electroconductive portion 203, and has a rectangular shape. The second electroconductive surface 292 is in contact with the pad 5 and has a rectangular shape. In the thickness direction Z of the substrate 1, the second electroconductive surface 292 is positioned between a mounting surface 41 of the sealing resin 4 and the reverse surface 12 of the substrate 1 (see FIG. 5). The side surfaces 293 are sandwiched between the first electroconductive surface 291 and the second electroconductive surface 292, and are covered with the sealing resin 4.

As shown in FIGS. 1, 2, 5, and 6, the semiconductor element 31 is mounted on the bottom surface electroconductive portions 201 of the electroconductive portions 20 by being bonded to the bottom surface electroconductive portions 201 via the joints 32. The semiconductor element 31 according to the present embodiment is a Hall (or Hall-effect) element, such as a GaAs Hall element. Advantageously, the GaAs Hall element is excellent in the linearity of Hall voltage with respect to the change in magnetic flux density, and is insusceptible to the change in temperature. In FIGS. 5 and 6, the upper side of the semiconductor element 31 is formed with a magnetically sensitive surface for detecting the change in magnetic flux density. Note that the semiconductor element 31 is not limited to a Hall element, and may be replaced with a different type or kind of element (typically an integrated circuit) having other functions. The semiconductor element 31 is a flip-chip element, and the upper side of the semiconductor element 31 is provided with electrode conductors 311. Each conductor 311 is in contact with a corresponding one of the joints 32. The electrode conductors 311 are made of Al, for example. In the present embodiment, in the thickness direction Z, a portion of the semiconductor element 31 is located between the mounting surface 41 of the sealing resin 4 and the (imaginary) plane containing the reverse surface 12 of the substrate 1. In other words, referring to FIG. 5, the semiconductor element 31 partially protrudes (downwards in the figure) from the recess 14 beyond the reverse surface 12 of the substrate 1.

As shown in FIGS. 1, 2, 5, and 6, each joint 32 is an electroconductive member interposed between the bottom surface electroconductive portion 201 and the electrode conductor 311. The joint 32 fixes the semiconductor element 31 to the bottom surface electroconductive portion 201, while ensuring the electrical conduction between the electroconductive portion 20 and the semiconductor element 31. In the present embodiment, each joint 32 may have a layered structure made up of two (or more) stacked layers such as a Ni layer and an Sn-containing alloy layer covering the Ni layer. Such an alloy layer may be made of a lead-free solder such as Sn—Sb alloy or Sn—Ag alloy.

As shown in FIGS. 2 to 7, the sealing resin 4 is made of an insulating material that is filled in the recess 14 and covers the side surfaces 293 of the posts 29 and the semiconductor element 31. The sealing resin 4 is black epoxy resin, for example. The sealing resin 4 has the mounting surface 41, first side surfaces 421, and second side surfaces 422.

As shown in FIGS. 2 to 6, the mounting surface 41 is a flat surface facing in the same direction as the reverse surface 12 of the substrate 1. When the semiconductor device A10 is mounted on a circuit board, the mounting surface 41 faces the circuit board. The pads 5 are exposed from the mounting surface 41 to the outside of the semiconductor device A10.

As shown in FIGS. 2 to 5, the first side surfaces 421 are a pair of flat surfaces that are sandwiched between the mounting surface 41 and the reverse surface 12 in the thickness direction Z, and that are separated from each other in the direction X. Each of the first side surfaces 421 has a rectangular shape and is flush with the first side surface 131 of the substrate 1. As shown in FIGS. 2 to 4 and FIG. 6, the second side surfaces 422 are a pair of flat surfaces that are sandwiched between the mounting surface 41 and the reverse surface 12 in the thickness direction Z, and that are separated from each other in the direction Y. Each of the second side surfaces 422 is flush with the second side surface 132 of the substrate 1. Both ends of each second side surface 422 in the direction X are connected to the pair of first side surfaces 421.

In the present embodiment, the sealing resin 4 is formed with four through-holes accommodating the corresponding number of posts 29. Each through-hole, as shown in FIG. 7, has a lower part referred to as "inner periphery surface" 43 in this specification, that extends between the mounting surface 41 of the sealing resin 4 and the second electroconductive surface 292 of the columnar portion 29 in the direction Z. The inner periphery surface 43 surrounds the four sides of the second electroconductive surface 292. With this configuration, as shown in FIG. 7, a cavity 44 (which has a shallow depth compared to the length of the above-mentioned through-hole) is formed in the sealing resin 4, defined by the second electroconductive surface 292 and the inner periphery surface 43. A portion of the pad 5 is filled in the cavity 44.

As shown in FIGS. 1 to 7, each of the pads 5 is an electroconductive member in contact with the second electroconductive surface 292 of the post 29, and is exposed to the outside of the semiconductor device A10. In the present embodiment, each of the pads 5 includes an inner layer 51, an outer layer 52, and an intermediate layer 53 disposed between the inner layer 51 and the outer layer 52.

As shown in FIGS. 5 and 7, the inner layer 51 is in contact with the second electroconductive surface 292 of the post 29. In the present embodiment, the inner layer 51 is made of Ni. The inner layer 51 has a buried portion 511 and a protrusion 512. The inner layer 51 is in contact with the second electroconductive surface 292, and fills the cavity 44 of the sealing resin 4. The protrusion 512 protrudes from the mounting surface 41 of the sealing resin 4 to the outside of the semiconductor device A10. In the present embodiment, the protrusion 512 is covered with the intermediate layer 53.

As shown in FIGS. 5 and 7, the outer layer 52 is exposed to the outside of the semiconductor device A10. In the present embodiment, the outer layer 52 is made of Au and covers the intermediate layer 53.

As shown in FIGS. 5 and 7, the intermediate layer 53 is interposed between the inner layer 51 and the outer layer 52. In the present embodiment, the intermediate layer 53 is made of Pd. As an other example, FIG. 8 illustrates the enlarged configuration of a pad 5 of a semiconductor device A11, which is a variation of the semiconductor device A10. As seen from FIG. 8, the semiconductor device A11 may differ from the semiconductor device A10 in that the outer layer 52 directly covers the protrusion 512 of the inner layer 51, i.e., without any interposed layer present between the outer layer 52 and the protrusion 512.

Referring now to FIGS. 9 to 27, an example of a method for manufacturing the semiconductor device A10 is described.

FIG. 9, FIGS. 12 to 23, and FIG. 25 are cross-sectional views showing manufacturing steps of the semiconductor device A10. FIGS. 10 and 27 are plan views showing manufacturing steps of the semiconductor device A10. FIG. 11 is a cross-sectional view taken along line XI-XI of FIG. 10. The cross-sectional position and cross-sectional area in FIG. 9, FIGS. 12 to 23, and FIG. 25 are the same as those in FIG. 11. FIG. 24 is a partially enlarged view of FIG. 23. FIG. 26 is a partially enlarged view of FIG. 25.

Figure 9:
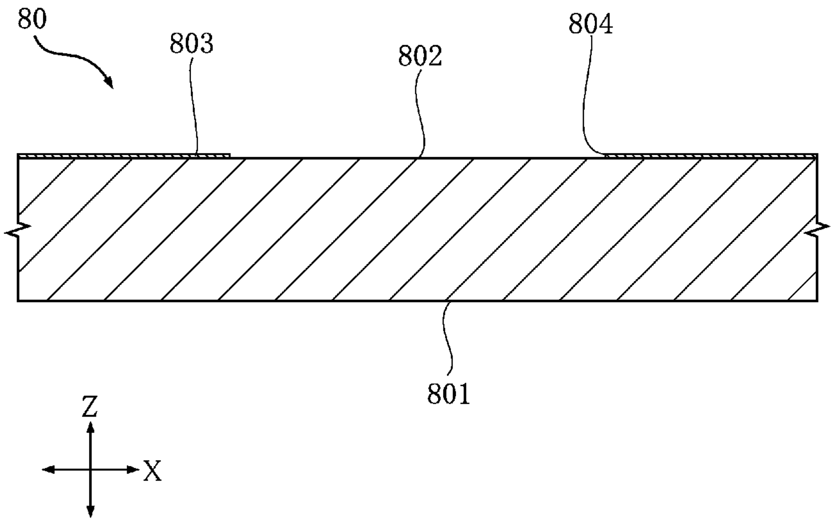
FIG. 9 is a cross-sectional view illustrating a manufacturing step of the semiconductor device in FIG. 1.
Figure 10:
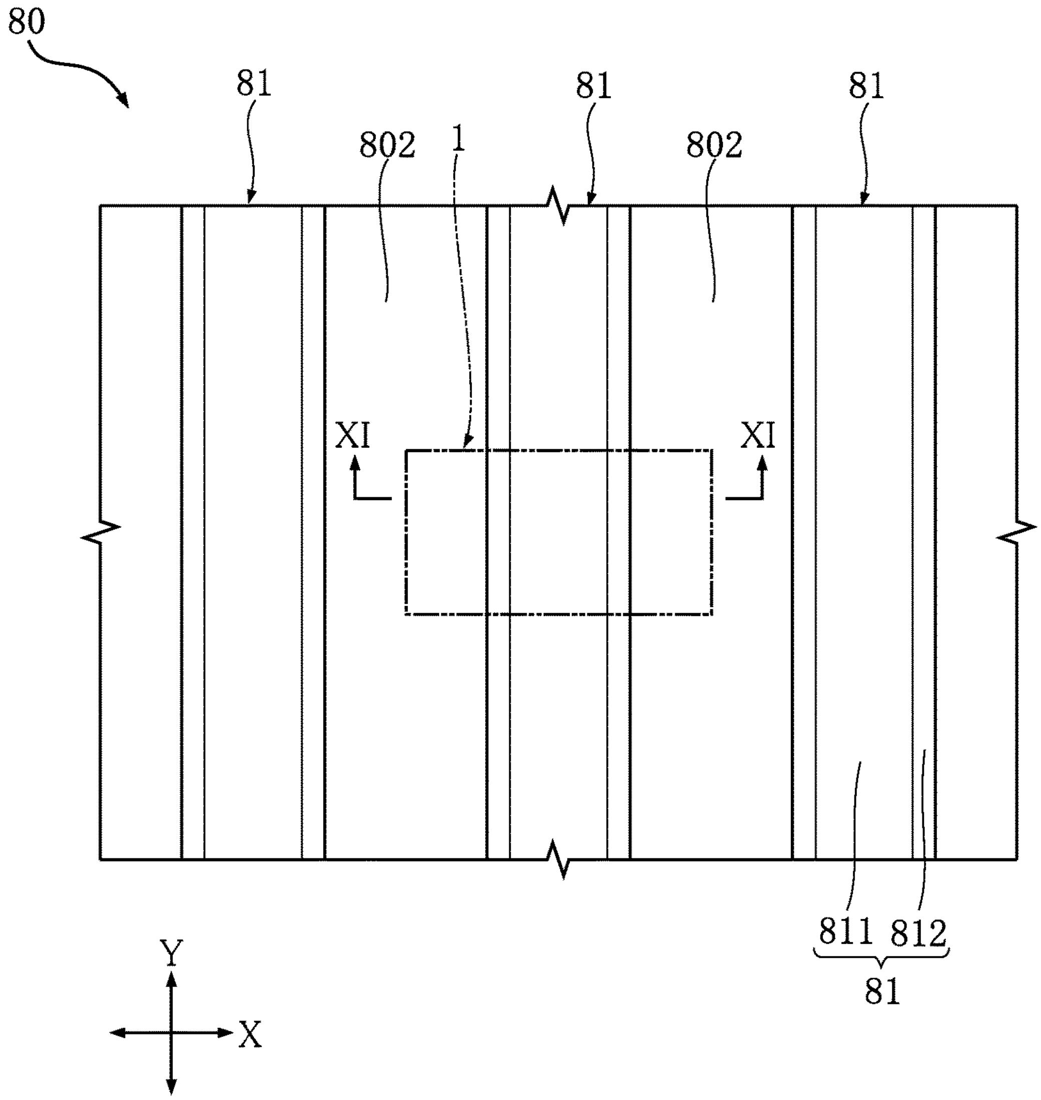
FIG. 10 is a plan view illustrating a manufacturing step of the semiconductor device in FIG. 1.
Figure 11:
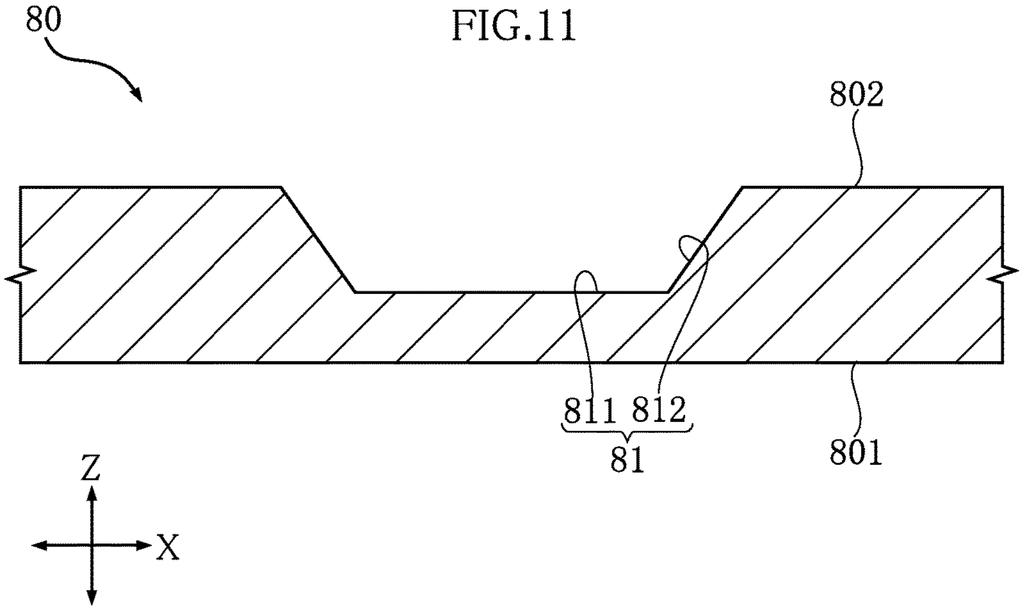
FIG. 11 is a cross-sectional view taken along line XI-XI of FIG. 10.

As shown in FIGS. 9 to 11, a base member 80 is prepared and a groove 81 is formed in the base member 80. As shown in FIG. 9, the base member 80 has an obverse surface 801 and a reverse surface 802 opposite to the obverse surface 801 in the thickness direction Z. The base member 80 is made of a monocrystal intrinsic semiconductor material, and the resulting groove 81 (see FIG. 11) subsides from the reverse surface 802 to have a bottom surface 811. The base member 80 may be an aggregate board, i.e., large enough to include portions each corresponding to a single substrate 1 of the semiconductor device A10. In the present embodiment, the intrinsic semiconductor material of the base member 80 is Si, and the base member 80 may be a silicon wafer.

The groove 81 may be formed by the following process. As shown in FIG. 9, an insulating film 803 is formed on the reverse surface 802 of the base member 80. The insulating film 803 may be a layer containing $Si_3N_4$ as the main component, and formed through plasma CVD. In this case, the reverse surface 802 is a (100) surface, which is entirely covered with the insulating film 803. Subsequently, a mask is formed on the insulating film 803 by photolithography, and the insulating film 803 is partially removed by reactive ion etching (RIE) which is a typical example of dry etching. When the insulating film 803 contains $Si_3N_4$ as the main component, $CF_4$ may be used as the etching gas. As a result of the etching, openings 804 each having a band-like shape extending in the direction Y are formed in the insulating film 803, and the reverse surface 802 is partially exposed through the respective openings 804 (only one opening is shown).

Then, a predetermined number of grooves 81 are formed in the base member 80 such that each groove 81 subsides from the reverse surface 802 and exposed from the corresponding one of the openings 804. After the grooves 81 are formed, all the insulating film 803 formed on the base member 80 is removed, as shown in FIGS. 10 and 11. Each groove 81 corresponds to the recess 14 of the substrate 1 of a semiconductor device A10. As shown in FIG. 11, the groove 81 has a bottom surface 811 that has a band-like shape extending in the direction Y, while also having a pair of intermediate side surfaces 812 that are connected at their lower ends (in FIG. 11) to the bottom surface 811. At its upper end (in FIG. 11), each intermediate side surface 812 is connected to the reverse surface 802. The bottom surface 811 corresponds to the bottom surface 141 of the recess 14 of the semiconductor device A10, and the intermediate side surfaces 812 correspond to the intermediate side surfaces 142 of the recess 14 of the semiconductor device A10. The grooves 81 may be formed collectively by anisotropic etching with use of an alkaline solution. The solution may be a potassium hydroxide (KOH) solution or a tetramethylammonium hydroxide (TMAH) solution. In the present embodiment, each intermediate side surface 812 is a (111) surface.

As described above, the insulating film 803 is removed from the base member 80 after the grooves 81 are formed. When the main component of the insulating film 803 is $Si_3N_4$, the removal of the insulating film 803 may be performed by reactive ion etching with $CF_4$ as the etching gas, or by wet etching using a heated phosphoric acid solution. After the insulating film 803 is removed, a plurality of parallel grooves 81 spaced apart from each other in the direction X and the reverse surface 802 adjacent to the grooves 81 can be visually recognized as shown in FIG. 10. In this figure, an area of the base member 80 that corresponds to the substrate 1 of the semiconductor device A10 is indicated by an imaginary line.

Next, as shown in FIGS. 12 to 16 and FIG. 19, electroconductive layers 82 (FIG. 19) are formed in contact with the grooves 81 and the reverse surface 802 of the base member 80. The electroconductive layers 82 correspond to the electroconductive portions 20 of the semiconductor device A10. The forming of the electroconductive layers 82 includes forming an underlying layer 821 in contact with the groove 81 and the reverse surface 802 and forming plating layers 822 in contact with the underlying layer 821. In the present embodiment, the forming of the electroconductive layers 82 further includes, after forming the plating layers 822, forming joint layers 842 on which a semiconductor element 841 (described below) is to be mounted. The joint layers 842 are formed in contact with parts of the plating layers 822 formed on the bottom surface 811 of the groove 81. The joint layers 842 correspond to the joints 32 of the semiconductor device A10. The electroconductive layers 82 and the joint layers 842 are formed through the following process.

Figure 12:
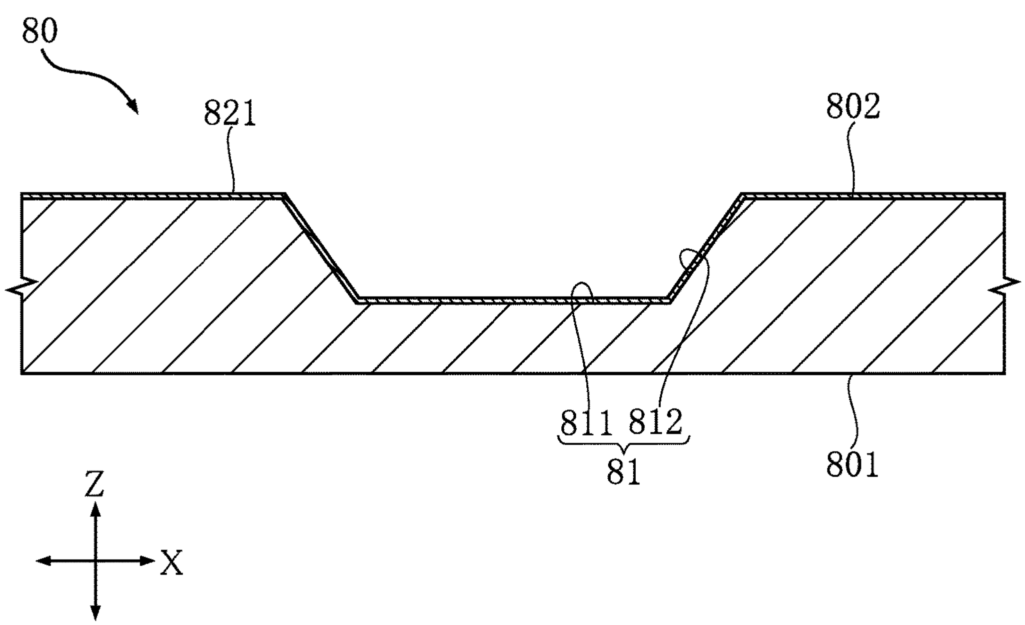
FIG. 12 is a cross-sectional view illustrating a manufacturing step of the semiconductor device in FIG. 1.

As shown in FIG. 12, the underlying layer 821 is formed in contact with the groove 81 and the reverse surface 802 of the base member 80. The underlying layer 821 corresponds to the underlying layers 21 of the electroconductive portions 20 of the semiconductor device A10. The underlying layer 821 is formed to cover the groove 81 and the reverse surface 802 by sputtering. According to the present embodiment, the underlying layer 821 is made of a Ti layer and a Cu layer that are stacked on each other and has an overall thickness of 200 to 300 nm. To form the underlying layer 821, the Ti layer is formed in contact with the base member 80, and then the Cu layer is formed in contact with the Ti layer.

Figure 13:
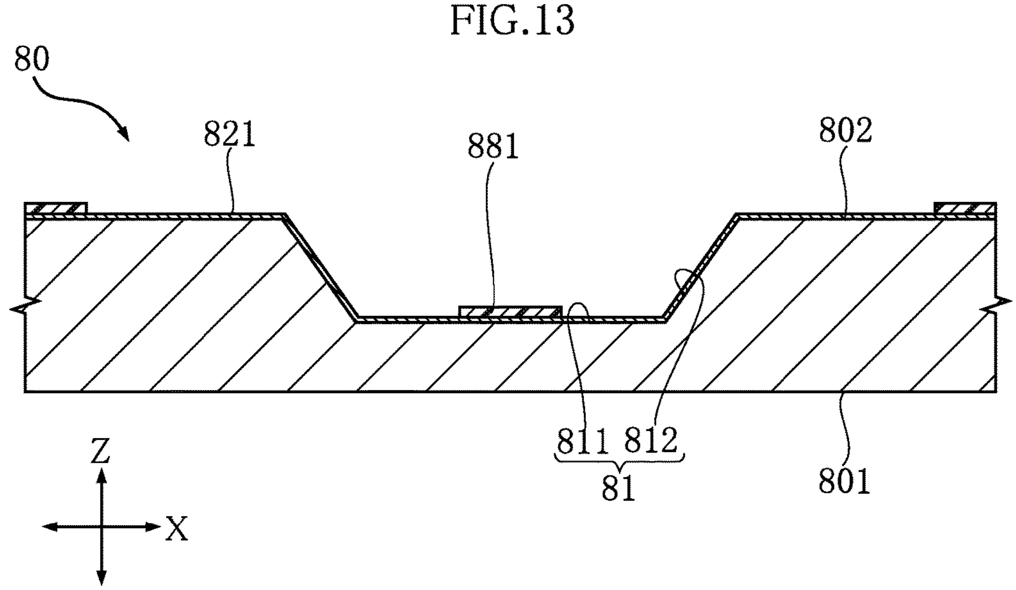
FIG. 13 is a cross-sectional view illustrating a manufacturing step of the semiconductor device in FIG. 1.

Next, as shown in FIG. 13, a first mask layer 881 for forming the plating layers 822 is formed on the underlying layer 821 by photolithography. After a photoresist is applied to cover the entirety of underlying layer 821, the photoresist is exposed and developed so that the first mask layer 881 is formed on the underlying layer 821. The photoresist is applied with use of a spin coater (rotary coating device). Since the photoresist according to the present embodiment is of a positive type, exposed portions of the photoresist are removed by a development solution, and the underlying layer 821 is exposed from the portions where the photoresist has been removed.

Figure 14:
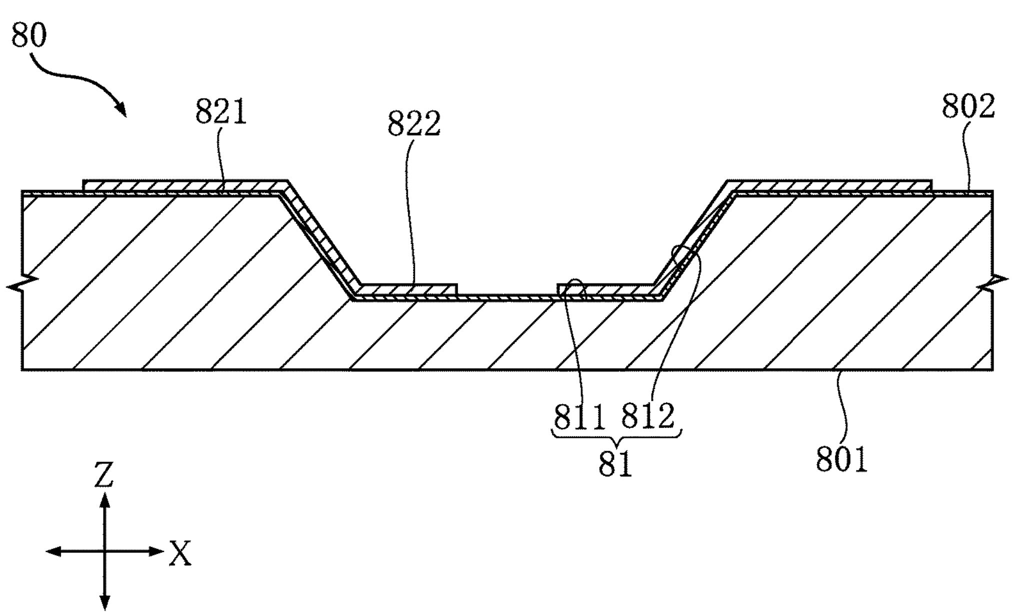
FIG. 14 is a cross-sectional view illustrating a manufacturing step of the semiconductor device in FIG. 1.

Next, as shown in FIG. 14, the plating layers 822 are formed in contact with the exposed portions of the underlying layer 821. The plating layers 822 correspond to the plating layers 22 of the electroconductive portions 20 of the semiconductor device A10. In the present embodiment, the plating layers 822 are formed by electroplating using the underlying layer 821 as an electroconductive path. The plating layers 822 may be made of Cu, and have a thickness of 3 to 10 μm. After the plating layers 822 are formed, all the first mask layer 881 formed on the underlying layer 821 is removed.

Figure 15:
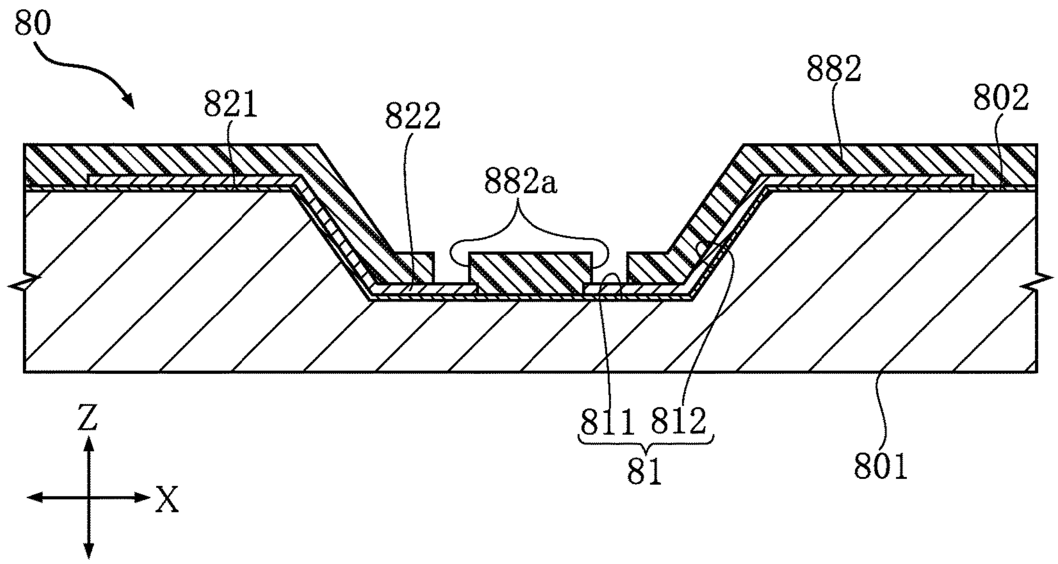
FIG. 15 is a cross-sectional view illustrating a manufacturing step of the semiconductor device in FIG. 1.

Next, as shown in FIG. 15, a second mask layer 882 for the joint layers 842 is formed on the underlying layer 821 and the plating layers 822 by photolithography. After a photoresist is applied to cover the underlying layer 821 and the plating layers 822, the photoresist is exposed and developed so that the second mask layer 882 is formed on the underlying layer 821. The photoresist used for forming the second mask layer 882 and the method for forming the second mask layer 882 are the same as those for the first mask layer 881. The second mask layer 882 is formed with openings 882*a* from which the plating layers 822 formed on the bottom surface 811 of the groove 81 are exposed. In the present embodiment, the openings 882*a* may have a rectangular parallelepiped shape.

Figure 16:
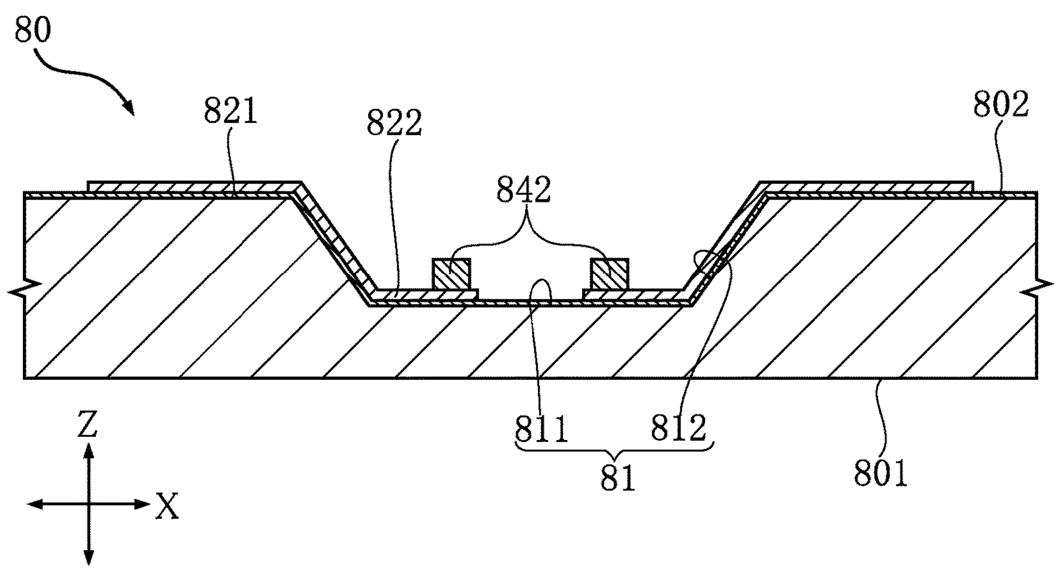
FIG. 16 is a cross-sectional view illustrating a manufacturing step of the semiconductor device in FIG. 1.

Next, as shown in FIG. 16, the joint layers 842 are formed in contact with the plating layers 822 formed on the bottom surface 811 of the groove 81. The joint layers 842 are formed to fill the openings 882*a* of the second mask layer 882, by electroplating using the underlying layer 821 and the plating layers 822 as an electroconductive path. Each of the joint layers 842 is made of a Ni layer and an alloy layer containing Sn that are stacked on each other. The alloy layer is made of lead-free solder such as Sn—Sb alloy or Sn—Ag alloy. After the joint layers 842 are formed, the second mask layer 882 formed on both the underlying layer 821 and the plating layers 822 is removed.

Figure 17:
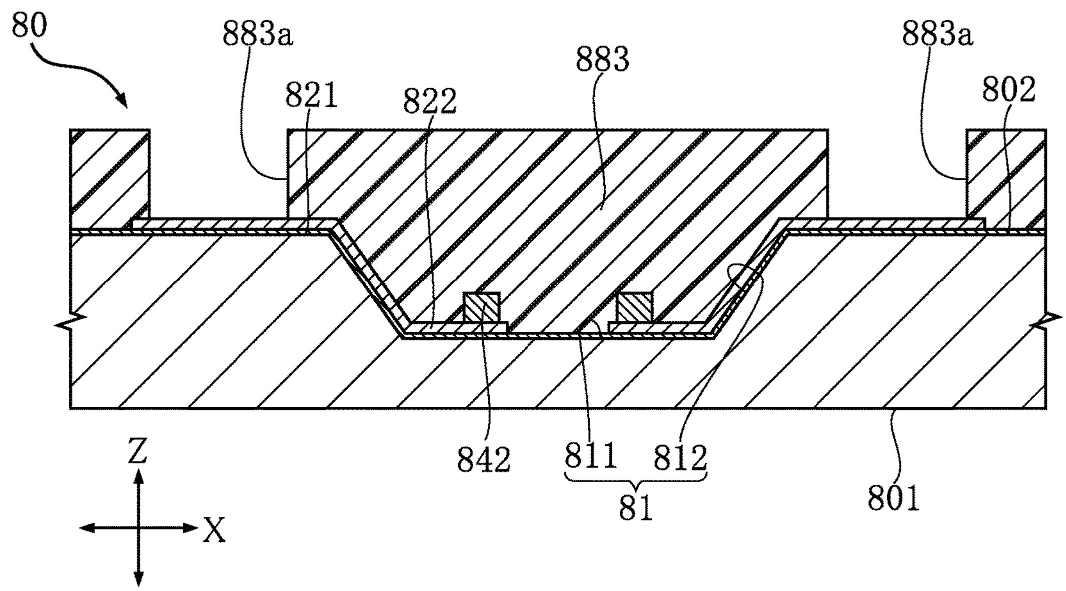
FIG. 17 is a cross-sectional view illustrating a manufacturing step of the semiconductor device in FIG. 1.
Figure 18:
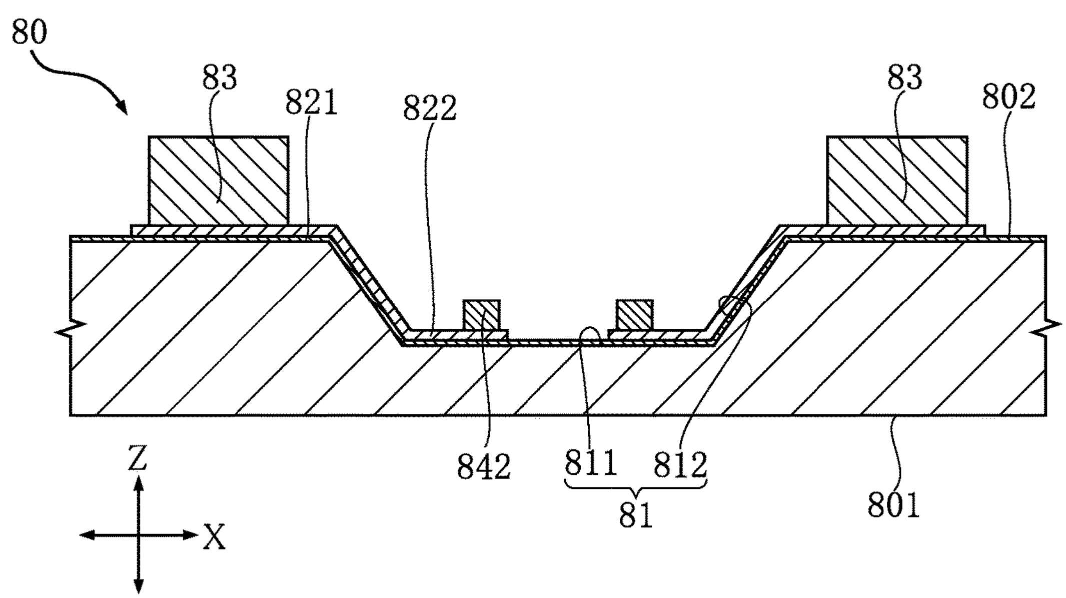
FIG. 18 is a cross-sectional view illustrating a manufacturing step of the semiconductor device in FIG. 1.

Next, as shown in FIGS. 17 and 18, posts 83 are formed in contact with the plating layers 822 formed on the reverse surface 802 of the base member 80. The posts 83 correspond to the posts 29 of the semiconductor device A10. The posts 83 are formed through the following process.

As shown in FIG. 17, a third mask layer 883 for forming the posts 83 is formed on the underlying layer 821, the plating layers 822, and the joint layers 842 by photolithography. After a photoresist is applied to cover the underlying layer 821, the plating layers 822, and the joint layers 842, the photoresist is exposed and developed so that the third mask layer 883 is formed on the underlying layer 821, the plating layers 822, and the joint layers 842. The photoresist used for forming the third mask layer 883 and the method for forming the third mask layer 883 are the same as those for the first mask layer 881. The third mask layer 883 is formed with openings 883*a* from which the plating layers 822 formed on the reverse surface 802 of the base member 80 are exposed. The openings 883*a* according to the present embodiment have a rectangular parallelepiped shape (not shown).

Next, as shown in FIG. 18, the posts 83 are formed in contact with the plating layers 822 formed on the reverse surface 802 of the base member 80. The posts 83 according to the present embodiment are formed to fill the openings 883*a* of the third mask layer 883, by electroplating using the underlying layer 821 and the plating layers 822 as an electroconductive path, similarly to the case of forming the joint layers 842. The posts 83 according to the present embodiment are made of Cu. After the posts 83 are formed, all the third mask layer 883 formed on the underlying layer 821, the plating layers 822, and the joint layers 842 is removed.

Figure 19:
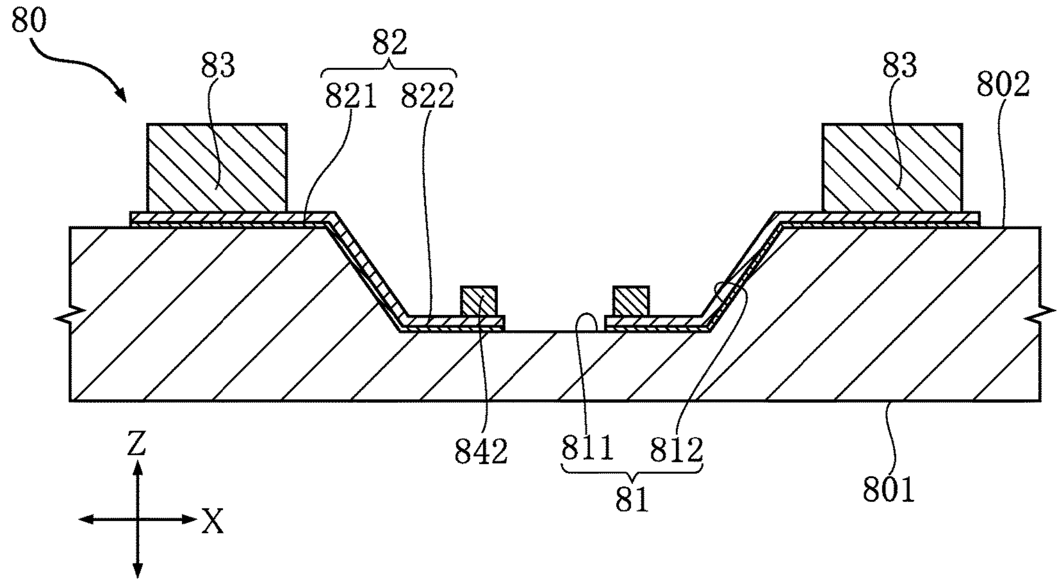
FIG. 19 is a cross-sectional view illustrating a manufacturing step of the semiconductor device in FIG. 1.

Next, as shown in FIG. 19, unnecessary portions of the underlying layer 821, which are not covered with the plating layers 822, are removed by wet etching, for example. The wet etching utilizes a mixed solution containing sulfuric acid ($H_2SO_4$) and hydrogen peroxide ($H_2O_2$), for example. The bottom surface 811 and the intermediate side surfaces 812 of the groove 81, as well as the reverse surface 802 of the base member 80, are exposed at the portions where the underlying layer 821 has been removed. The remaining stacked portions of the underlying layer 821 and the plating layers 822 serve as the electroconductive layers 82. The posts 83 are in contact with the electroconductive layers 82 formed on the reverse surface 802 of the base member 80.

Figure 20:
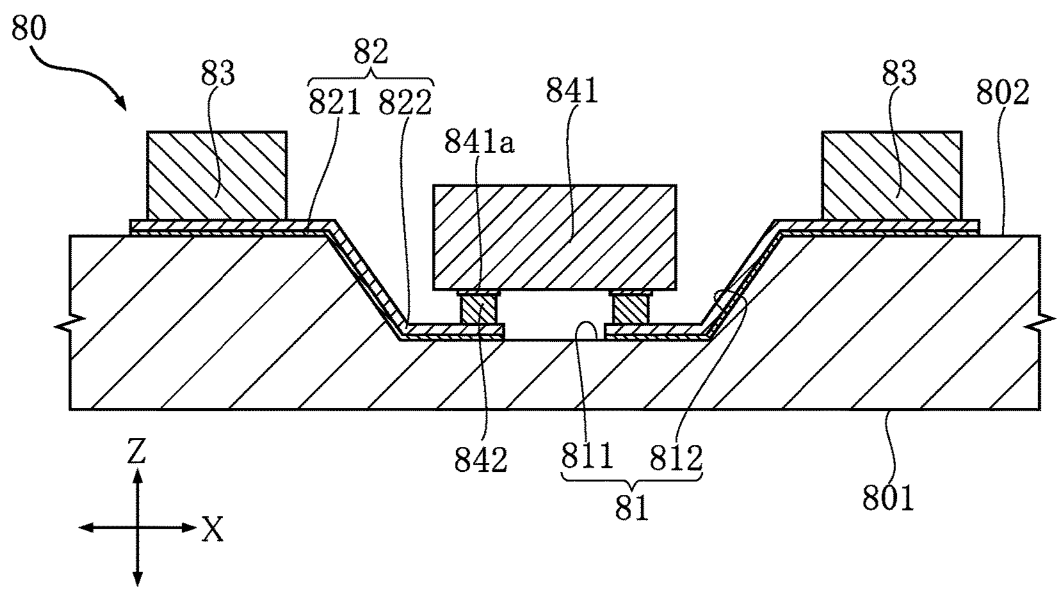
FIG. 20 is a cross-sectional view illustrating a manufacturing step of the semiconductor device in FIG. 1.

Next, as shown in FIG. 20, a semiconductor element 841 is mounted on the electroconductive layers 82 formed on the bottom surface 811 of the groove 81, so that the semiconductor element 841 is accommodated in the groove 81. The semiconductor element 841 corresponds to the semiconductor element 31 of the semiconductor device A10. The semiconductor element 841 is mounted by flip chip bonding (FCB). Specifically, flux is applied to electrode conductors 841*a* of the semiconductor element 841, and with use of a flip chip bonder, the semiconductor element 841 is provisionally attached to the joint layers 842 in a manner such that each conductor 841*a* is in contact with a corresponding one of the joint layers 842. At this point, the joint layers 842 are sandwiched between the electroconductive layers 82 and the semiconductor element 841. Next, the joint layers 842 are softened or melted to an appropriate extent by reflow soldering, and then hardened by cooling. As a result, each joint layer 842 is fused to both the conductor 841*a* and the layer 82, whereby the non-provisional (e.g., semipermanent) mounting of the semiconductor element 841 is accomplished.

Figure 21:
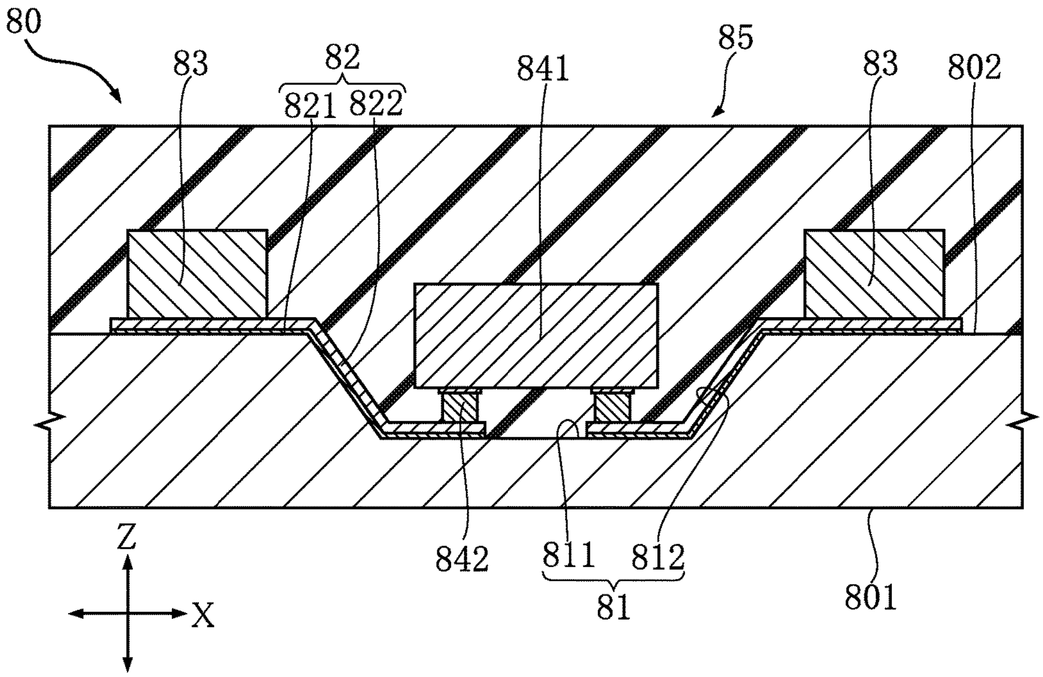
FIG. 21 is a cross-sectional view illustrating a manufacturing step of the semiconductor device in FIG. 1.

Next, as shown in FIG. 21, a sealing resin 85 is formed such that the sealing resin 85 fills the groove 81 and covers the posts 83 and the semiconductor element 841. The sealing resin 85 corresponds to the sealing resin 4 of the semiconductor device A10. In the present embodiment, the sealing resin 85 is formed by thermally hardening a fluid, black epoxy resin by transfer molding.

Figure 22:
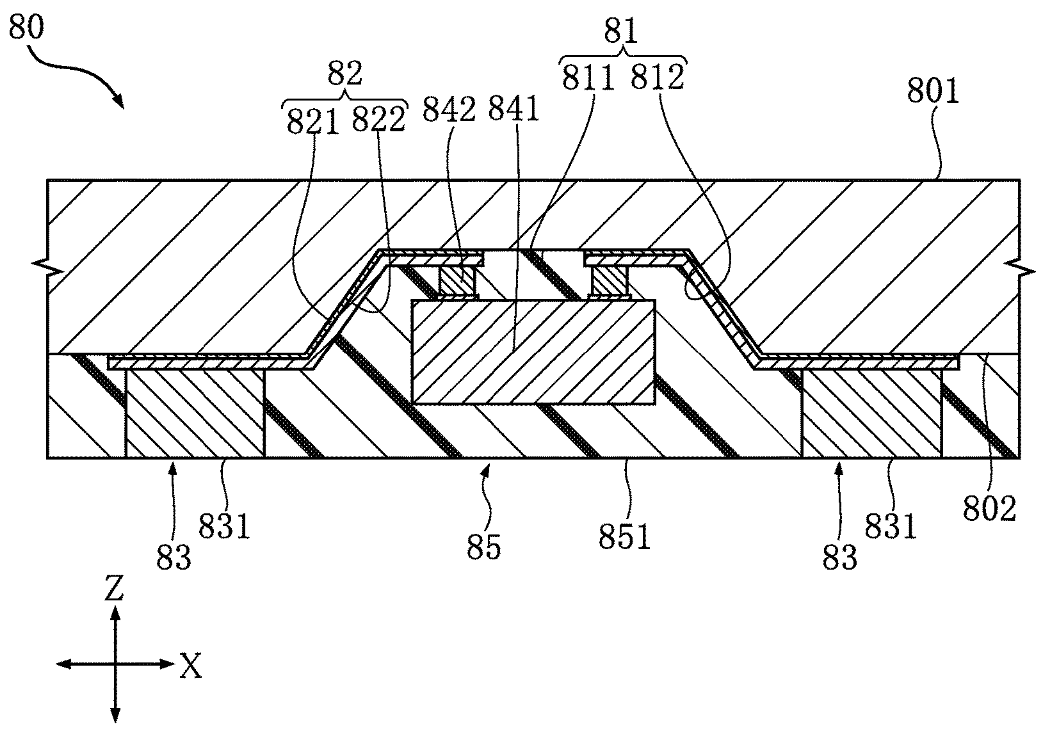
FIG. 22 is a cross-sectional view illustrating a manufacturing step of the semiconductor device in FIG. 1.

Next, as shown in FIG. 22, an end of each post 83 is exposed from the sealing resin 85. In the present embodiment, the base member 80 is reversed to cause the obverse surface 801 of the base member 80 to face upward in FIG. 22, and parts of the sealing resin 85 are then removed by mechanical grinding from the lower side in FIG. 22. In this way, the posts 83 are exposed from the sealing resin 85, and at the same time a mounting surface 851 facing downward in FIG. 22 is formed. As shown in the figure, each post 83 has a flat surface 831 exposed from the mounting surface 851.

Next, as shown in FIGS. 23 to 26, pads 86 are formed in contact with the respective posts 83 at their exposed surfaces 831. The pads 86 correspond to the pads 5 of the semiconductor device A10. The pads 86 are formed through the following process.

Figure 23:
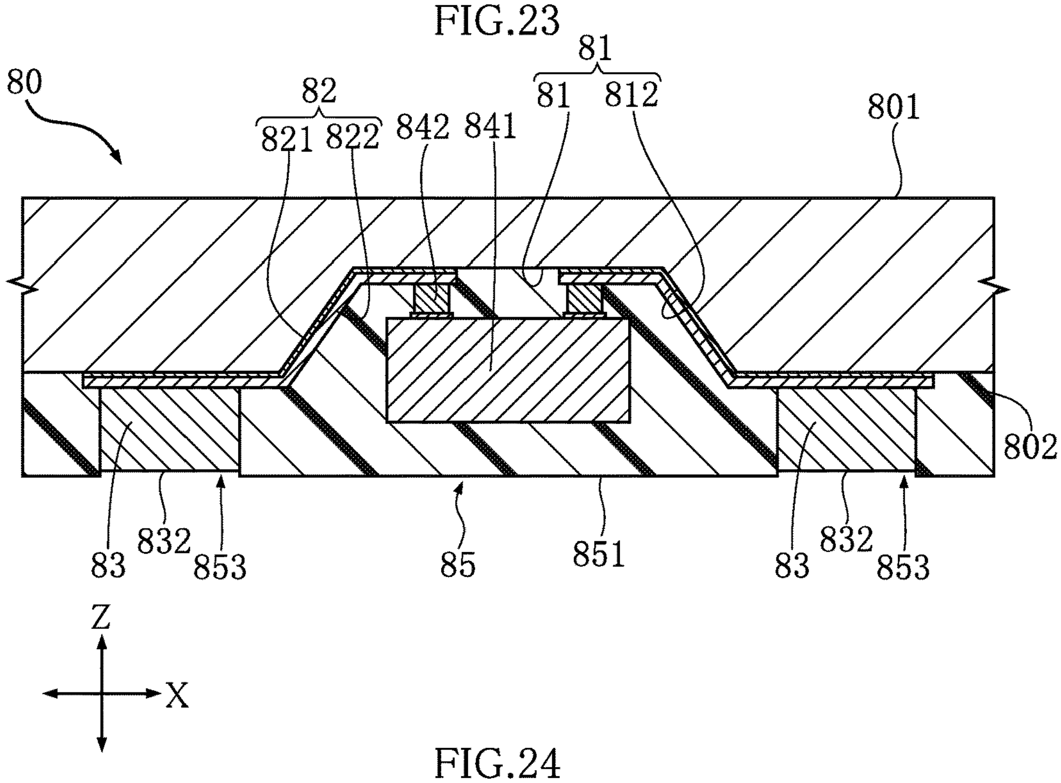
FIG. 23 is across-sectional view illustrating a manufacturing step of the semiconductor device in FIG. 1.
Figure 24:
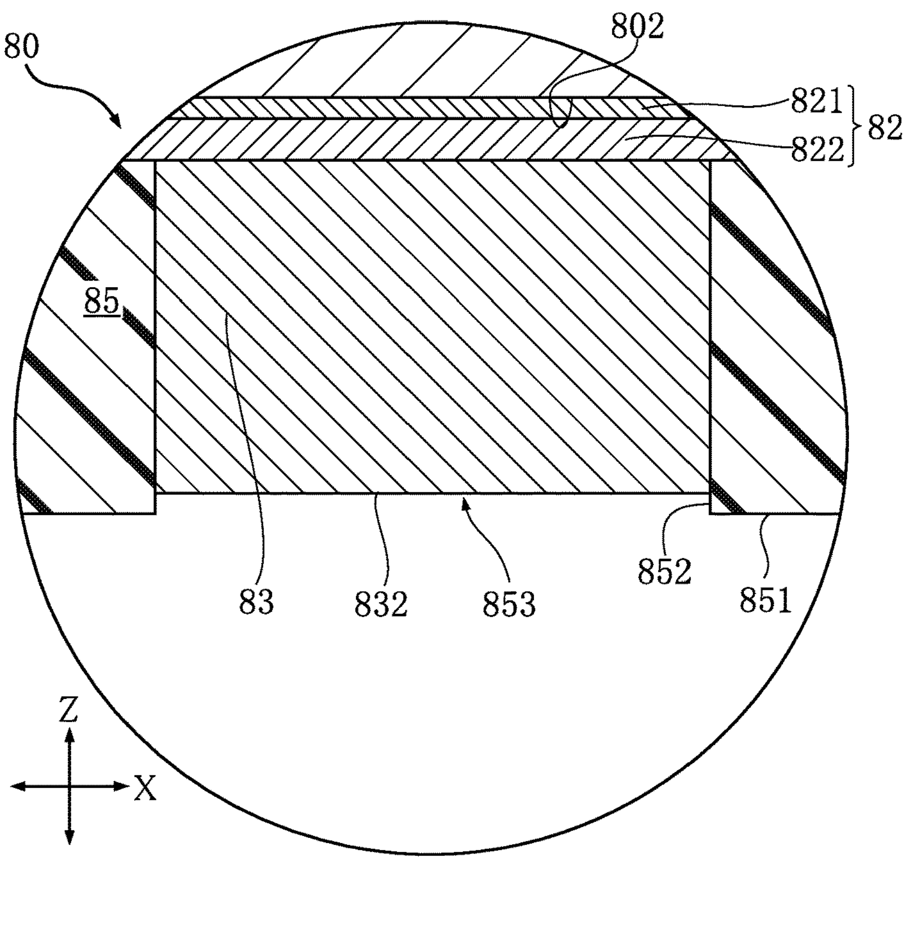
FIG. 24 is a partially enlarged view of FIG. 23.

As shown in FIGS. 23 and 24, etching is performed on the exposed surfaces 831 of the respective posts 83 so that a predetermined volume of each post 83 is removed. In the present embodiment, wet etching is implemented with use of a mixed solution containing sulfuric acid ($H_2SO_4$) and hydrogen peroxide ($H_2O_2$), for example. As a result, an electroconductive surface 832 is formed on each post 83, where the electroconductive surface 832 subsides from the mounting surface 851 of the sealing resin 85 while being exposed to the outside from the sealing resin 85. Due to the etching, the sealing resin 85 is formed with inner periphery surfaces 852 each corresponding to the removed volume of the post 83. As shown in FIG. 24, each periphery surface 852 extends vertically (along the thickness direction Z) to connect the mounting surface 851 and the electroconductive surface 832, while also surround the relevant electroconductive surface 832. At a position corresponding to each post 83, the sealing resin 85 has a cavity 853 defined by the electroconductive surface 832 and the inner periphery surface 852.

Figure 25:
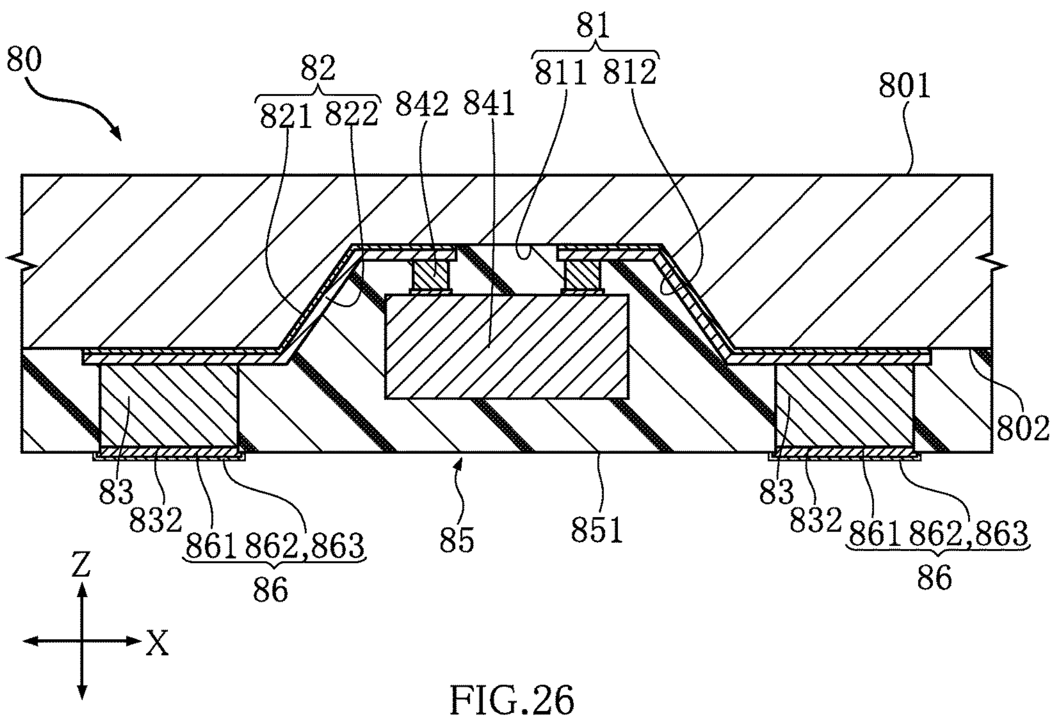
FIG. 25 is a cross-sectional view illustrating a manufacturing step of the semiconductor device in FIG. 1.
Figure 26:
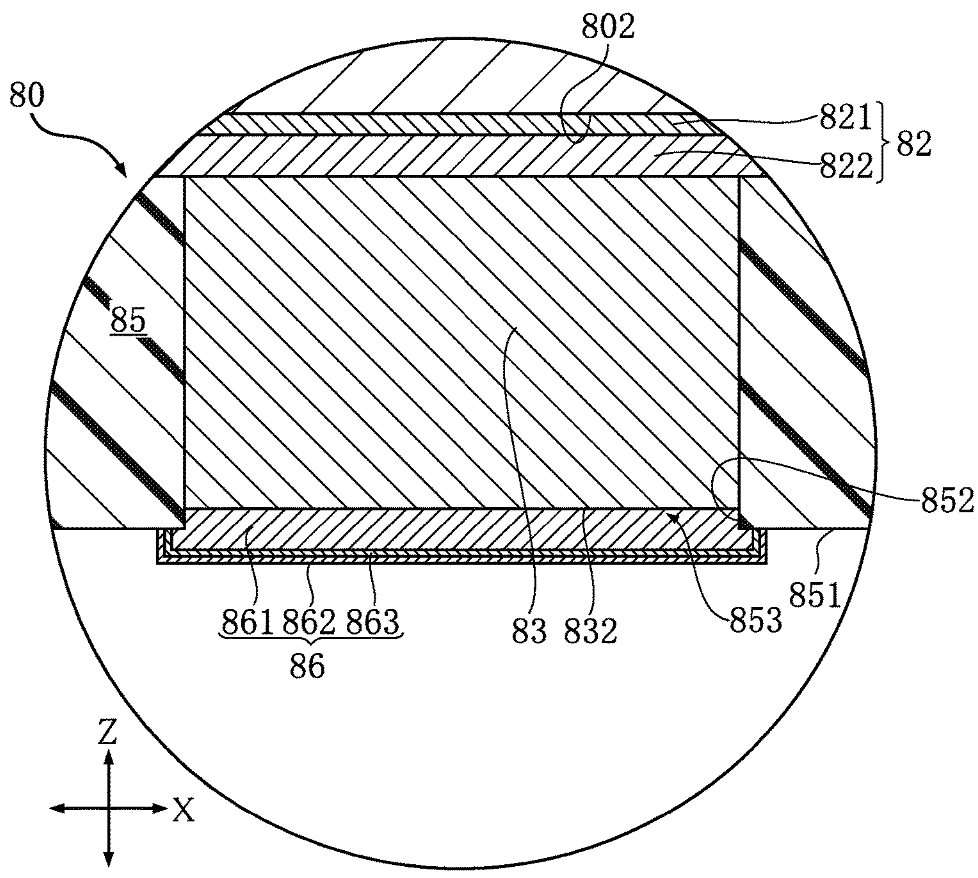
FIG. 26 is a partially enlarged view of FIG. 25.
Figure 27:
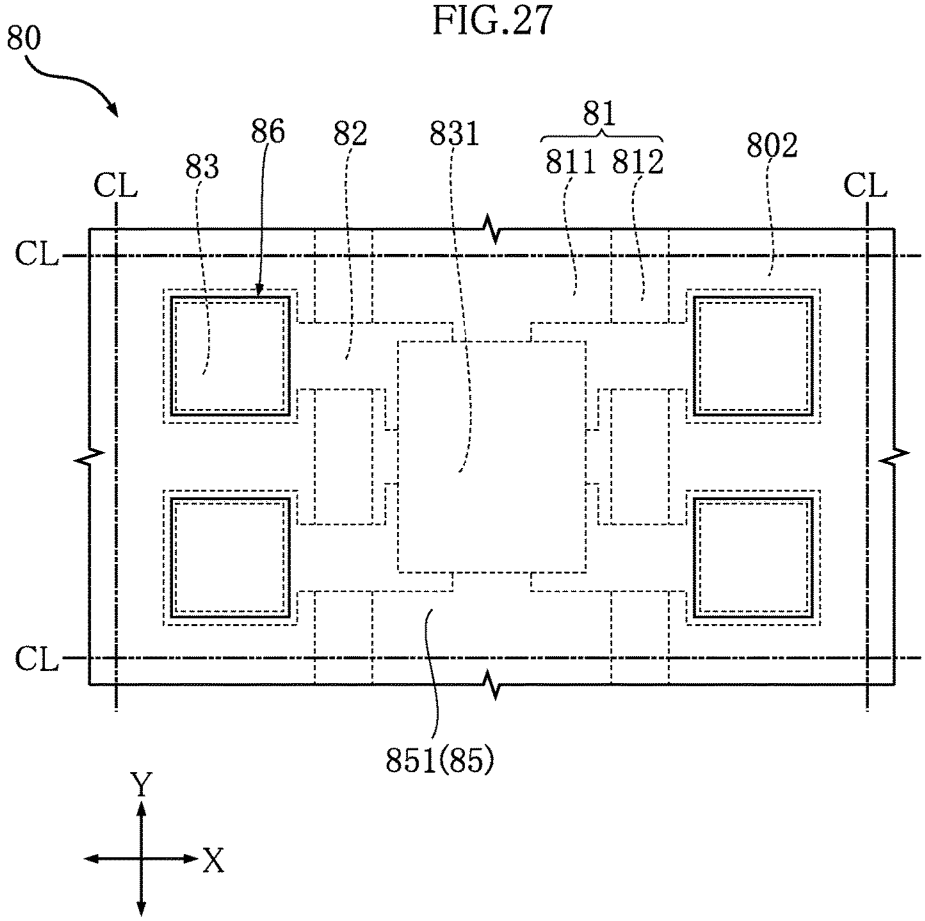
FIG. 27 is a plan view illustrating a manufacturing step of the semiconductor device in FIG. 1.

Next, as shown in FIGS. 25 and 26, pads 86 are formed by electroless plating, so as to be in contact with the respective electroconductive surfaces 832 of the posts 83. In the present embodiment, each pad 86 is made up of three stacked layers, i.e., an inner layer 861 in contact with the electroconductive surface 832 and filling the cavity 853, an intermediate layer 863 covering the inner layer 861, and an outer layer 862 covering the intermediate layer 863. To form each of the pads 86, first the inner layer 861 is made of Ni so as to fill the cavity 853 and further protrude beyond the mounting surface 851 of the sealing resin 85. Next, the intermediate layer 863 is made of Pd so as to cover the inner layer 861. Finally, the outer layer 862 is made of Au so as to cover the intermediate layer 863. In an embodiment, the pads 86 may be formed without the intermediate layers 863. In this case, the outer layers 862 directly cover the inner layers 861.

Finally, as shown in FIG. 27, the base member 80 and the sealing resin 85 are cut along cut line CL such that the base member 80 covered with the sealing resin 85 is divided into pieces that each correspond to a single substrate 1. The base member 80 and the sealing resin 85 may be cut by plasma dicing. Each of the divided pieces obtained in the aforementioned cutting step functions as the semiconductor device A10.

The advantages of the semiconductor device A10 and manufacturing method will now be described.

As explained above, the semiconductor device A10 includes posts 29 each having the first electroconductive surface 291 in contact with the electroconductive portion 20 provided on the reverse surface 12 of the substrate 1, and the second electroconductive surface 292 in contact with the pad 5 exposed to the outside. In the thickness direction Z, the second electroconductive surface 292 is positioned between the mounting surface 41 of the sealing resin 4 and the reverse surface 12 of the substrate 1. With such a structure, the posts 29 do not have any part protruding outside of the sealing resin 4. Hence, the pads 5 to be subsequently formed will have a predetermined proper size.

According to the method for manufacturing the semiconductor device A10, the pads 86 are formed after certain parts of the posts 83 exposed from the sealing resin 85 are removed. In this manner, the entirety of each post 29 is accommodated within the sealing resin 4, in particular without protruding from the mounting surface 41 of the sealing resin 4. Since the posts 83 are made of Cu, parts of the posts 83 can be easily removed by etching.

Also, in the present method, as explained with reference to FIGS. 21-22, the posts 83 and the sealing resin 85 are partially removed by mechanical grinding. In this manner, it is possible to make an accurate adjustment to the height (the length in the thickness direction Z) of the posts 29.

Each of the pads 5 includes the inner layer 51 (made of Ni) and the outer layer 52 (made of Au), where the inner layer 51 is in contact with the post 29, and the outer layer 52 is exposed to the outside. Owing to such a multi-layer structure and the intervening post (in particular, the presence of the inner layer 51), the electroconductive portion 20 (made of Cu) can be protected from a thermal shock likely to occur when the semiconductor device A10 is mounted. Furthermore, in mounting the semiconductor device A10, the outer layer 52 improves the wettability of lead-free cream solder to the pad 5.

Further, each pad 5 may include the intermediate layer 53 (made of Pd) provided between the inner layer 51 and the outer layer 52. This structure further improves the effect of protecting the electroconductive portion 20 from the above-noted thermal shock.

As shown in FIG. 7, for example, the inner layer 51 of each pad 5 includes the buried portion 511 filling the cavity 44, and the protrusion 512 protruding to outside beyond the mounting surface 41. With such a structure, even when metal burrs are formed and left on the second electroconductive surface 292, these burrs can be enclosed by the buried portion 511, and further by the protrusion 512 covering the buried portion 511. Thus, it is possible to prevent the metal burrs from being exposed to the outside. The outer layer 52 of each pad 5 is formed to cover the relatively large the protrusion 512. Hence, the surface area of the pad 5 exposed to the outside becomes large enough to ensure good adherence of the cream solder.

Each of the electroconductive portions 20 includes the underlying layer 21 and the plating layer 22 stacked on each other, and the underlying layer 21 is in contact with the substrate 1. As shown in FIG. 7, the underlying layer 21 may include the first underlying layer 211 made of Ti and in contact with the substrate 1, and the second underlying layer 212 made of Cu and interposed between the first underlying layer 211 and the plating layer 22. With this structure, the first underlying layer 21 can prevent component diffusion of the second underlying layer 212 and the plating layer 22 into the substrate 1. The intervening first underlying layer 21 can also prevent the peeling off of the second underlying layer 212 from the substrate 1. These advantageous effects also hold for the step of forming the electroconductive layers 82 during the above manufacturing method of the semiconductor device A10, whereby the plating layers 822 can be effectively formed by electroplating.

According to the method of manufacturing the semiconductor device A10, the semiconductor element 841 is accurately mounted by flip chip bonding on the electroconductive layers 82 formed on the groove 81, owing to the joint layers 842 in contact with the electroconductive layers 82 formed on the bottom surface 811 of the groove 81. In addition, flip chip bonding can ensure the electrical connection between the semiconductor element 841 and the electroconductive layers 82. As compared to the case of using wire bonding to ensure the electrical connection between the semiconductor element 841 and the electroconductive layers 82, the size of the groove 81 can be decreased. This contributes to the size reduction of the semiconductor device A10.

The present disclosure is not limited to the above embodiments. Various changes may be made to the illustrated structures of the elements of the present disclosure.

The invention claimed is:

1. A semiconductor device comprising:

a substrate having a first surface and a second surface that are spaced apart from each other in a thickness direction, the substrate being formed with a recess subsiding from the second surface;

a semiconductor element disposed in the recess;

an electroconductive portion extending from the recess onto the second surface of the substrate and electrically connected to the semiconductor element;

a post disposed at the second surface of the substrate and having a first electroconductive surface in contact with the electroconductive portion, a second electroconductive surface opposite to the first electroconductive surface and a side surface extending between the first electroconductive surface and the second electroconductive surface;

a sealing resin having a mounting surface that faces in a same direction as the second surface of the substrate, the sealing resin covering the side surface of the post and the semiconductor element; and a pad in contact with the second electroconductive surface of the post and exposed to an outside from the mounting surface of the sealing resin, wherein the substrate is made of a monocrystal intrinsic semiconductor material, and in the thickness direction, the second electroconductive surface of the post is offset from the mounting surface of the sealing resin toward the second surface of the substrate.

2. The semiconductor device according to claim 1, wherein the pad includes an inner layer and an outer layer, the inner layer being in contact with the second electroconductive surface of the post, the outer layer being exposed to the outside.

3. The semiconductor device according to claim 2, wherein the sealing resin has an inner periphery surface surrounding the second electroconductive surface of the post, a cavity is defined by the inner periphery surface and the second electroconductive surface, and the inner layer of the pad includes a buried portion filling the cavity.

4. The semiconductor device according to claim 3, wherein the inner layer has a protrusion protruding beyond the mounting surface of the sealing resin.

5. The semiconductor device according to claim 2, wherein the inner layer is made of Ni, and the outer layer is made of Au.

6. The semiconductor device according to claim 2, wherein the pad includes an intermediate layer between the inner layer and the outer layer.

7. The semiconductor device according to claim 6, wherein the intermediate layer is made of Pd.

8. The semiconductor device according to claim 1, wherein the post has a rectangular parallelepiped shape.

9. The semiconductor device according to claim 1, wherein the post is made of Cu.

10. The semiconductor device according to claim 1, wherein in the thickness direction, a part of the semiconductor element protrudes toward the mounting surface of the sealing resin beyond the second surface of the substrate.

11. The semiconductor device according to claim 1, wherein the recess has a bottom surface supporting the semiconductor element, and an intermediate side surface connected to the bottom surface and the second surface of the substrate, the bottom surface being orthogonal to the thickness direction, the intermediate side surface being inclined relative to the bottom surface.

12. The semiconductor device according to claim 11, wherein the bottom surface of the recess is rectangular in plan view.

13. The semiconductor device according to claim 12, wherein the intermediate side surface of the recess comprises a pair of slant surfaces separated apart from each other in a first direction perpendicular to the thickness direction, the recess comprises a pair of openings separated apart from each other in a second direction perpendicular to both the thickness direction and the first direction, and the sealing resin is exposed to the outside at each of the openings.

14. The semiconductor device according to claim 13, wherein the slant surfaces have the same inclination angle relative to the bottom surface.

15. The semiconductor device according to claim 14, wherein the intrinsic semiconductor material is Si.

16. The semiconductor device according to claim 15, wherein the second surface of the substrate is a (100) surface.

17. The semiconductor device according to claim 11, further comprising a joint layer that electrically connects the semiconductor element to the electroconductive portion.

18. The semiconductor device according to claim 17, wherein the joint layer includes an Ni layer and an alloy layer containing Sn and stacked on the Ni layer.

19. The semiconductor device according to claim 1, wherein the electroconductive portion includes an underlying layer and a plating layer stacked on the underlying layer, the underlying layer being in contact with the substrate and thinner than the plating layer.

20. The semiconductor device according to claim 19, wherein the underlying layer includes a first underlying layer in contact with the substrate, and a second underlying layer interposed between the first underlying layer and the plating layer, and the second underlying layer and the plating layer are made of a same material.

21. The semiconductor device according to claim 20, wherein the second underlying layer and the plating layer are made of Cu.

22. The semiconductor device according to claim 20, wherein the first underlying layer is made of Ti.

23. A method for manufacturing a semiconductor device, the method comprising:

forming a groove in a base member having a first surface and a second surface that are spaced apart from each other in a thickness direction, the base member being made of a monocrystal intrinsic semiconductor material, the groove subsiding from the second surface and having a bottom surface;

forming an electroconductive layer in contact with the groove and the second surface of the base member;

forming a post at the second surface of the base member, the post being in contact with the electroconductive layer;

mounting a semiconductor element on the bottom surface of the groove so as to be electrically connected to the electroconductive layer;

forming a sealing resin covering the post and the semiconductor element;

exposing a part of the post from the sealing resin; and forming a pad in contact with the exposed part of the post, wherein the pad is formed after the exposed part of the post is removed.

24. The method according to claim 23, wherein the post is formed by electroplating.

25. The method according to claim 24, wherein the exposed part of the post is removed by etching.

26. The method according to claim 23, wherein the exposing of the part of the post is performed by removing a part of the sealing resin by mechanical grinding.

27. The method according to claim 23, wherein the pad is formed by electroless plating.

28. The method according to claim 23, wherein the groove is formed by anisotropic etching.

29. The method according to claim 28, wherein the intrinsic semiconductor material is Si, and the second surface of the base member is a (100) surface.

30. The method according to claim 23, wherein the forming of the electroconductive layer includes forming an underlying layer in contact with the groove and the second surface of the base member by sputtering, and forming a plating layer in contact with the underlying layer by electroplating.

31. The method according to claim 30, wherein the forming of the electroconductive layer includes forming a joint layer by electroplating after the plating layer is formed, the joint layer being connected to the semiconductor element.

* * * * *